(12) United States Patent
Lee et al.

(10) Patent No.: US 10,153,295 B2
(45) Date of Patent: Dec. 11, 2018

(54) NONVOLATILE MEMORY DEVICES AND METHODS OF FORMING SAME

(71) Applicant: Samsung Electronics Co., Ltd., Suwon-si, Gyeonggi-do (KR)

(72) Inventors: Woong-Seop Lee, Hwaseong-si (KR); Seokcheon Baek, Hwaseong-si (KR); Jinhyun Shin, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/613,602

(22) Filed: Jun. 5, 2017

(65) Prior Publication Data

US 2017/0301688 A1    Oct. 19, 2017

Related U.S. Application Data

(63) Continuation of application No. 15/252,931, filed on Aug. 31, 2016, now Pat. No. 9,704,878.

(60) Provisional application No. 62/239,048, filed on Oct. 8, 2015.

(30) Foreign Application Priority Data

Nov. 23, 2015 (KR) .................. 10-2015-0164177

(51) Int. Cl.
| H01L 27/115 | (2017.01) |
| H01L 27/11582 | (2017.01) |
| H01L 27/11556 | (2017.01) |
| H01L 27/11575 | (2017.01) |

(52) U.S. Cl.
CPC .. *H01L 27/11582* (2013.01); *H01L 27/11556* (2013.01); *H01L 27/11575* (2013.01)

(58) Field of Classification Search
CPC ............ H01L 21/8221; H01L 27/0611; H01L 27/0688; H01L 27/11514; H01L 27/11507–27/11536; H01L 27/11551; H01L 27/1156–27/1158; H01L 27/11597; H01L 27/1203
See application file for complete search history.

(56) References Cited

U.S. PATENT DOCUMENTS

| 8,564,050 | B2 | 10/2013 | Park et al. |
| 8,659,946 | B2 | 3/2014 | Jin et al. |
| 8,704,288 | B2 | 4/2014 | Lee et al. |
| 2012/0003831 | A1 | 1/2012 | Kang et al. |
| 2012/0164821 | A1 | 6/2012 | Kim et al. |
| 2013/0187118 | A1 | 7/2013 | Murooka |
| 2014/0054787 | A1 | 2/2014 | Eun et al. |
| 2014/0162420 | A1 | 6/2014 | Oh et al. |
| 2014/0197546 | A1 | 7/2014 | Hwang et al. |
| 2014/0329379 | A1 | 11/2014 | Kim et al. |
| 2014/0363980 | A1 | 12/2014 | Kawamata et al. |

(Continued)

*Primary Examiner* — Cuong B Nguyen
(74) *Attorney, Agent, or Firm* — Myers Bigel, P.A.

(57) ABSTRACT

A vertical NAND-type memory device includes a vertical stack of inter-gate insulating layers and gate electrodes arranged in an alternating sequence on an underlying substrate, which includes a cell array region and a contact region therein. At least one NAND-type channel structure is provided, which extends vertically through the vertical stack of inter-gate insulating layers and gate electrodes. An end sidewall of a first of the gate electrodes, which extends laterally over at least a portion of the contact region, has a vertical slope that is less steep than vertical slopes of end sidewalls of a first plurality of the gate electrodes extending between the first of the gate electrodes and the substrate.

17 Claims, 29 Drawing Sheets

(56) References Cited

U.S. PATENT DOCUMENTS

| | | |
|---|---|---|
| 2015/0056816 A1 | 2/2015 | Sato et al. |
| 2015/0255468 A1 | 9/2015 | Chen |
| 2015/0263029 A1 | 9/2015 | Kim et al. |

NONVOLATILE MEMORY DEVICES AND METHODS OF FORMING SAME

REFERENCE TO PRIORITY APPLICATIONS

This U.S. non-provisional patent application is a continuation claiming priority to U.S. patent application Ser. No. 15/252,931, filed Aug. 31, 2016, which itself claims priority under 35 U.S.C. § 119 to U.S. Provisional Patent Application Ser. No. 62/239,048, filed Oct. 8, 2015 and Korean Patent Application No. 10-2015-0164177, filed Nov. 23, 2015, the disclosures of which are hereby incorporated herein by reference in their entireties.

BACKGROUND

Embodiments of the inventive concepts relate to semiconductor devices and methods for manufacturing the same and, more particularly, to three-dimensional (3D) semiconductor memory devices and methods for manufacturing the same.

Semiconductor devices have been highly integrated to provide high performance and low costs. The integration density of semiconductor devices may affect the costs of the semiconductor devices, thereby resulting in an increasing demand for more highly integrated semiconductor devices. An integration density of a conventional two-dimensional (2D) or planar memory device may be approximated by an area a unit memory cell occupies. Therefore, the integration density of conventional 2D memory devices may be greatly affected by techniques for forming fine patterns. However, since extremely high-priced apparatuses are needed to form fine patterns, the integration density of 2D memory devices continues to increase but is still limited.

Three-dimensional (3D) semiconductor devices including three-dimensionally arranged memory cells have been developed to overcome the above limitations. However, production of 3D semiconductor memory devices may be expensive as compared with 2D semiconductor memory devices and may have concerns regarding yield and providing reliable device characteristics.

SUMMARY

Embodiments of the inventive concepts provide semiconductor devices capable of reducing risks in processes and methods for manufacturing the same.

According to some embodiments of the invention, a non-volatile memory device (e.g., vertical NAND) includes a vertical stack of inter-gate insulating layers and gate electrodes arranged in an alternating sequence on an underlying substrate. The substrate includes a cell array region and a contact region therein. The contact region may be configured as a peripheral circuit region extending adjacent the cell array region. At least one NAND-type channel structure is provided, which extends vertically through the vertical stack of inter-gate insulating layers and gate electrodes. This NAND-type channel structure is provided on the cell array region. According to preferred aspects of these embodiments, an end sidewall of a first of the gate electrodes, which extends laterally over at least a portion of the contact region, has a vertical slope that is less steep than vertical slopes of end sidewalls of a first plurality of the gate electrodes extending between the first of the gate electrodes and the substrate. According to additional aspects of these embodiments, the ends of the gate electrodes in the vertical stack are arranged in a descending stair-step pattern over the contact region. The end sidewall of the first of the gate electrodes is closer to the NAND-type channel structure than the end sidewalls of the first plurality of the gate electrodes.

According to still further aspects of these embodiments, the vertical slope of the end sidewall of the first of the gate electrodes is less steep than vertical slopes of end sidewalls of a second plurality of the gate electrodes extending on the first of the gate electrodes. The first of the gate electrodes is also sandwiched between the first plurality of the gate electrodes and the second plurality of the gate electrodes. In addition, an end sidewall of a second of the gate electrodes that extends laterally over at least a portion of the contact region has a vertical slope that is less steep than the vertical slopes of the end sidewalls of the second plurality of the gate electrodes. The second plurality of the gate electrodes may extend between the second of the gate electrodes and the first of the gate electrodes. Moreover, the second of the gate electrodes may be an uppermost gate electrode in the vertical stack, relative to a surface of the substrate. These embodiments further include a first vertical contact plug, which is electrically connected to an upper surface of the first of the gate electrodes, and a second vertical contact plug, which is electrically connected to an upper surface of the second of the gate electrodes. The first vertical contact plug is longer than the second vertical contact plug. The vertical slope of the end sidewall of the first of the gate electrodes is preferably in a range from 5 degrees to 60 degrees as measured relative to a normal to a primary surface of the substrate and, more preferably, an average vertical slope of the end sidewall of the first of the gate electrodes is in a range from 30 degrees to 60 degrees as measured relative to a normal to a primary surface of the substrate.

According to additional embodiments of the invention, a semiconductor device may include a substrate including a first region and a second region spaced apart from the first region in one direction, a first stack structure including first insulating layers and first gate electrodes alternately and repeatedly stacked on the substrate, and a channel structure vertically extending in the first stack structure disposed on the substrate of the first region. The first stack structure may have a stepwise structure on the substrate of the second region. An end of at least one of the first gate electrodes of the second region may include a first sidewall. An end of each of others of the first gate electrodes of the second region may have a second sidewall having a steeper slope than the first sidewall.

In some of these embodiments of the invention, a first line may make a first angle with a top surface of the first insulating layer disposed under the at least one of the first gate electrodes when viewed from a cross-sectional view taken along the one direction. A second line may make a second angle with a top surface of the first insulating layer disposed under each of the others of the first gate electrodes when viewed from a cross-sectional view taken along the one direction. The first line may be a line connecting a top end and a bottom end of the first sidewall, and the second line may be a line connecting a top end and a bottom end of the second sidewall. The second angle may be greater than the first angle.

In some embodiments, the first angle may range from 30 degrees to 85 degrees. In other embodiments, the at least one of the first gate electrodes may include a first upper gate electrode corresponding to an uppermost one of the first gate electrodes. The others of the first gate electrodes may include first lower gate electrodes under the first upper gate electrode. In still further embodiments, the at least one of the first gate electrodes may include a first pad portion extending in the one direction in the second region. A length in the one direction of the first pad portion may become progressively greater from a top surface toward a bottom surface of the first pad portion.

In still further embodiments, the others of the first gate electrodes may include second pad portions extending in the one direction in the second region, respectively. The semiconductor device may further include contact plugs penetrating the first insulating layers so as to be connected to the first and second pad portions, respectively.

In additional embodiments, the semiconductor device may further include a second stack structure including second insulating layers and second gate electrodes alternately and repeatedly stacked on the first stack structure. The substrate may further include a third region disposed between the first region and the second region. The second stack structure may extend from the first region into the third region. The channel structure may further extend upward into the second stack structure. The second stack structure may have a stepwise structure on the substrate of the third region. An end of at least one of the second gate electrodes of the third region may have a third sidewall. An end of each of others of the second gate electrodes of the third region may have a fourth sidewall having a steeper slope than the third sidewall.

In some embodiments, the third sidewall may have a substantially same slope as the first sidewall. The number of the first gate electrodes may be equal to the number of the second gate electrodes. The at least one of the second gate electrodes may include a second upper gate electrode corresponding to an uppermost one of the second gate electrodes. The others of the second gate electrodes may include second lower gate electrodes disposed under the second upper gate electrode.

In still further embodiments, the semiconductor device may further include a gate insulating layer disposed between the channel structure and the first gate electrodes. The first stack structure may include a plurality of first stack structures, and the plurality of first stack structures may extend in the one direction in parallel to each other.

A semiconductor device may include a substrate including a cell array region and a contact region spaced apart from the cell array region in one direction, a stack structure including insulating layers and gate electrodes alternately and repeatedly stacked on the substrate, and a channel structure penetrating the stack structure of the cell array region so as to be connected to the substrate. At least one of the gate electrodes may include a first pad portion extending in the one direction in the contact region, and a length in the one direction of the first pad portion may become progressively greater from a top surface toward a bottom surface of the first pad portion.

A first line may make a first angle with a top surface of the insulating layer disposed under the first pad portion when viewed from a cross-sectional view taken along the one direction. The first line may be a line connecting a top end and a bottom end of a first sidewall of an end of the first pad portion. The first angle may range from 30 degrees to 85 degrees.

In some embodiments, the at least one of the gate electrodes may include an uppermost one of the gate electrodes and others of the gate electrodes except the at least one gate electrode may include second pad portions in the contact region, respectively. A first sidewall of the end of the first pad portion may have a gentler slope than a second sidewall of an end of each of the second pad portions.

In some embodiments, the at least one gate electrode including the first pad portion may include two or more gate electrodes respectively including the first pad portions. At least two of the others of the gate electrodes may be disposed between the two or more gate electrodes respectively including the first pad portions.

In some embodiments, the stack structure may have a stepwise structure on the substrate of the contact region. The semiconductor device may further include a tunnel insulating layer, a charge storage layer, and a blocking insulating layer sequentially stacked between the channel structure and the gate electrodes.

According to additional embodiments of the invention, a method for manufacturing a semiconductor memory device is provided, which includes forming a stack structure layer including insulating layers and sacrificial layers alternately and repeatedly stacked on a substrate, forming a mask pattern on the stack structure layer, and forming one end portion of the stack structure layer into a stepwise structure using the mask pattern as an each mask. The forming of the one end portion of the stack structure layer into the stepwise structure may include repeating a cycle. The cycle may include performing a first etching process of etching at least one insulating layer exposed by the mask pattern, performing a second etching process of etching at least one sacrificial layer under the at least one insulating layer using the mask pattern as the etch mask, and trimming the mask pattern to reduce a width and a height of the mask pattern. An etch rate of the sacrificial layers by the second etching process of at least one of the repeated cycles may be lower than an etch rate of the sacrificial layers by the second etching process of another or others of the repeated cycles.

In some embodiments, the at least one cycle may be the last one of the repeated cycles. An uppermost one of the sacrificial layers may be formed to have a first sidewall during the second etching process of the at least one cycle. Others of the sacrificial layers except the uppermost sacrificial layer may be formed to have second sidewalls, respectively, during the second etching process of the at least one cycle. The first sidewall may have a gentler slope than each of the second sidewalls.

In some embodiments, a ratio of the etch rate of the sacrificial layers to an etch rate of the insulating layers in the second etching process of the at least one cycle may be higher than a ratio of the etch rate of the sacrificial layers to an etch rate of the insulating layers in the second etching process of the another or others of the repeated cycles.

In some embodiments, upper portions of the exposed insulating layers may be recessed while the cycle is repeated. In addition, upper portions of the sacrificial layers disposed under the exposed insulating layers may be recessed during the first etching process of the at least one cycle. The cycle may be repeated until a lowermost insulating layer and a lowermost sacrificial layer are etched.

These methods may further include forming channel holes that penetrate the stack structure layer of a cell array region of the substrate to expose the substrate, and forming a gate insulating layer and a channel layer that are sequentially stacked on an inner sidewall of each of the channel holes. These methods may also include selectively removing the sacrificial layers to form recess regions between the insulating layers, and forming gate electrodes in the recess regions, respectively.

BRIEF DESCRIPTION OF THE DRAWINGS

The inventive concepts will become more apparent in view of the attached drawings and accompanying detailed description.

DETAILED DESCRIPTION OF THE EMBODIMENTS

Figure 1:
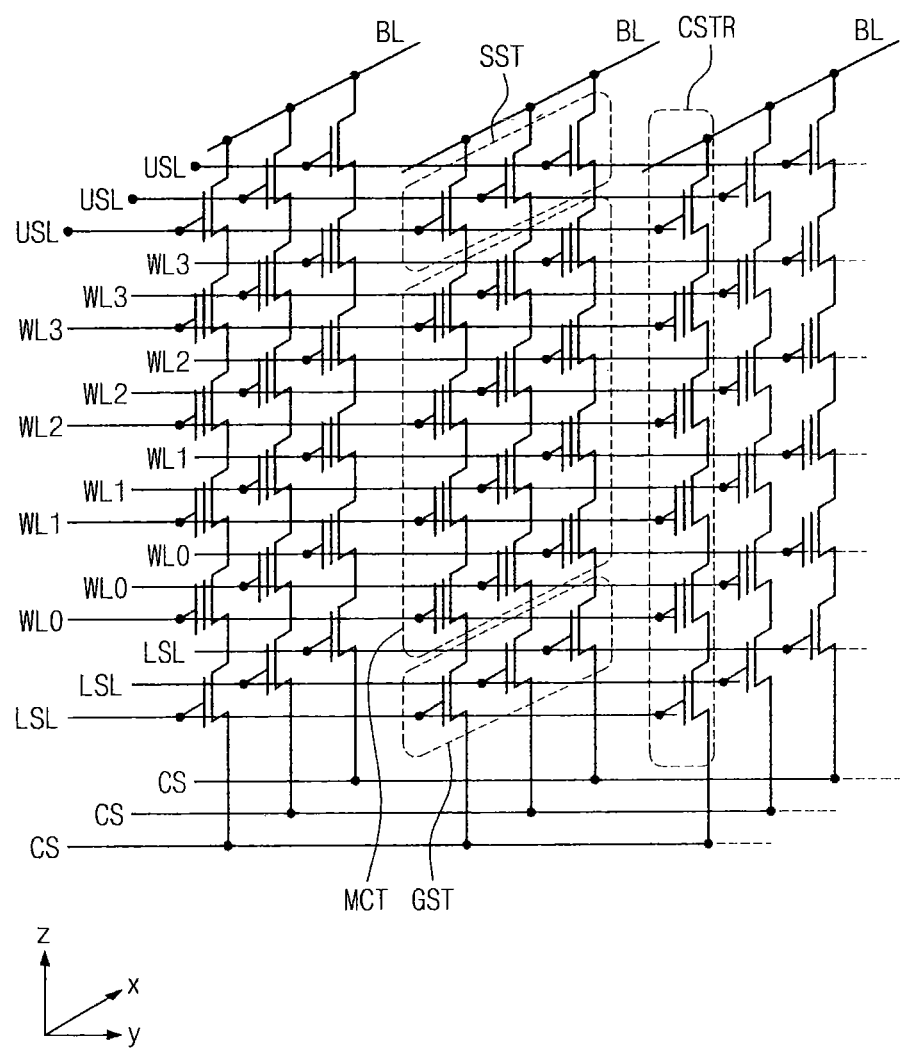
FIG. 1 is a schematic circuit diagram illustrating a cell array of a three-dimensional (3D) semiconductor memory device according to some embodiments of the inventive concepts.

The inventive concepts will now be described more fully hereinafter with reference to the accompanying drawings, in which exemplary embodiments of the inventive concepts are shown. The inventive concepts and methods of achieving them will be apparent from the following exemplary embodiments that will be described in more detail with reference to the accompanying drawings. The embodiments of the inventive concept may, however, be embodied in different forms and should not be constructed as limited to the embodiments set forth herein. Rather, these embodiments are provided so that this disclosure will be thorough and complete, and will fully convey the scope of the inventive concept to those skilled in the art.

As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Similarly, it will be understood that when an element such as a layer, region or substrate is referred to as being "on" another element, it can be directly on the other element or intervening elements may be present. In contrast, the term "directly" means that there are no intervening elements. Additionally, the embodiment in the detailed description will be described with sectional views as ideal exemplary views of the inventive concepts. Accordingly, shapes of the exemplary views may be modified according to manufacturing techniques and/or allowable errors. Therefore, the embodiments of the inventive concepts are not limited to the specific shape illustrated in the exemplary views, but may include other shapes that may be created according to manufacturing processes.

Exemplary embodiments of aspects of the present inventive concepts explained and illustrated herein include their complementary counterparts. The same reference numerals or the same reference designators denote the same elements throughout the specification.

FIG. 1 is a schematic circuit diagram illustrating a cell array of a three-dimensional (3D) semiconductor memory device according to some embodiments of the inventive concepts. Referring to FIG. 1, a cell array of a 3D semiconductor memory device according to some embodiments of the inventive concepts may include a common source line CS, a plurality of bit lines BL, and a plurality of cell strings CSTR connected between the common source line CS and the bit lines BL.

The common source line CS may be a conductive layer disposed on a substrate or a dopant region formed in the substrate. In some embodiments, the common source line CS may be a conductive pattern (e.g., a metal line) vertically spaced apart from the substrate. The bit lines BL may be conductive patterns (e.g., metal lines) vertically spaced apart from the substrate. In some embodiments, the bit lines BL may intersect the common source line CS and may be vertically spaced apart from the common source line CS. The bit lines BL may be two-dimensionally arranged when viewed from a plan view. A plurality of the cell strings CSTR may be connected in parallel to each of the bit lines BL. The cell strings CSTR may be connected in common to the common source line CS. In other words, a plurality of the cell strings CSTR may be disposed between the common source line CS and the plurality of bit lines BL. In some embodiments, the common source line CS may include a plurality of common source lines CS two-dimensionally arranged. In some embodiments, the same voltage may be applied to the plurality of the common source lines CS. In certain embodiments, the common source lines CS may be electrically controlled independently of each other.

Each of the cell strings CSTR may include a ground selection transistor GST connected to the common source line CS, a string selection transistor SST connected to the bit line BL, and a plurality of memory cell transistors MCT interposed between the ground and string selection transistors GST and SST. The ground selection transistor GST, the memory cell transistors MCT, and the string selection transistor SST may be connected in series to each other in the order named.

The common source line CS may be connected in common to sources of the ground selection transistors GST. A lower selection line LSL, a plurality of word lines WL0 to WL3 and an upper selection line USL which are disposed between the common source line CS and the bit lines BL may be used as a gate electrode of the ground selection transistor GST, gate electrodes of the memory cell transistors MCT and a gate electrode of the string selection transistor SST, respectively. Each of the memory cell transistors MCT may include a data storage element.

Figure 2:
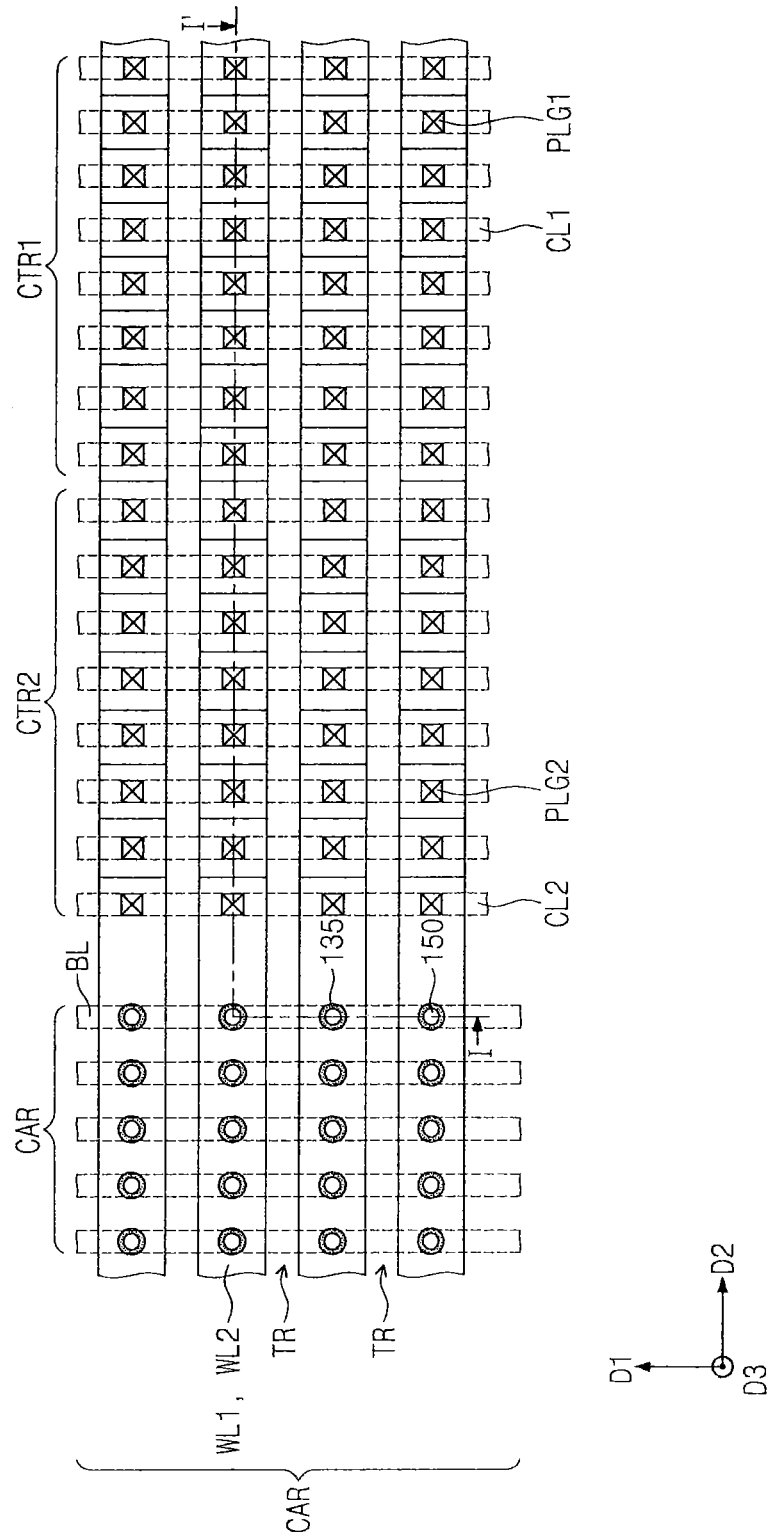
FIG. 2 is a plan view illustrating a 3D semiconductor memory device according to some embodiments of the inventive concepts.
Figure 3A:
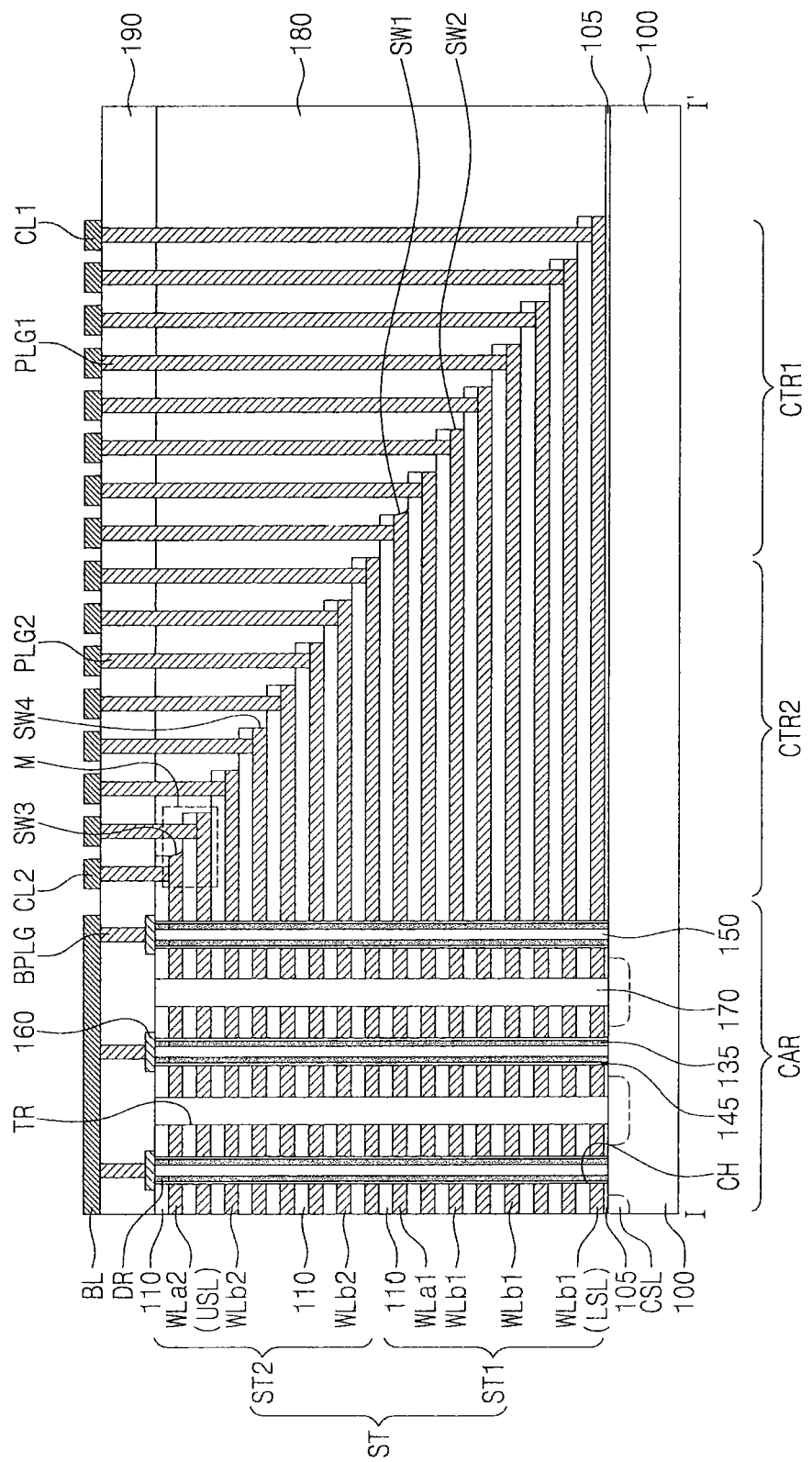
FIG. 3A is a cross-sectional view taken along a line I-I' of FIG. 2 to illustrate a 3D semiconductor memory device according to some embodiments of the inventive concepts.
Figure 3B:
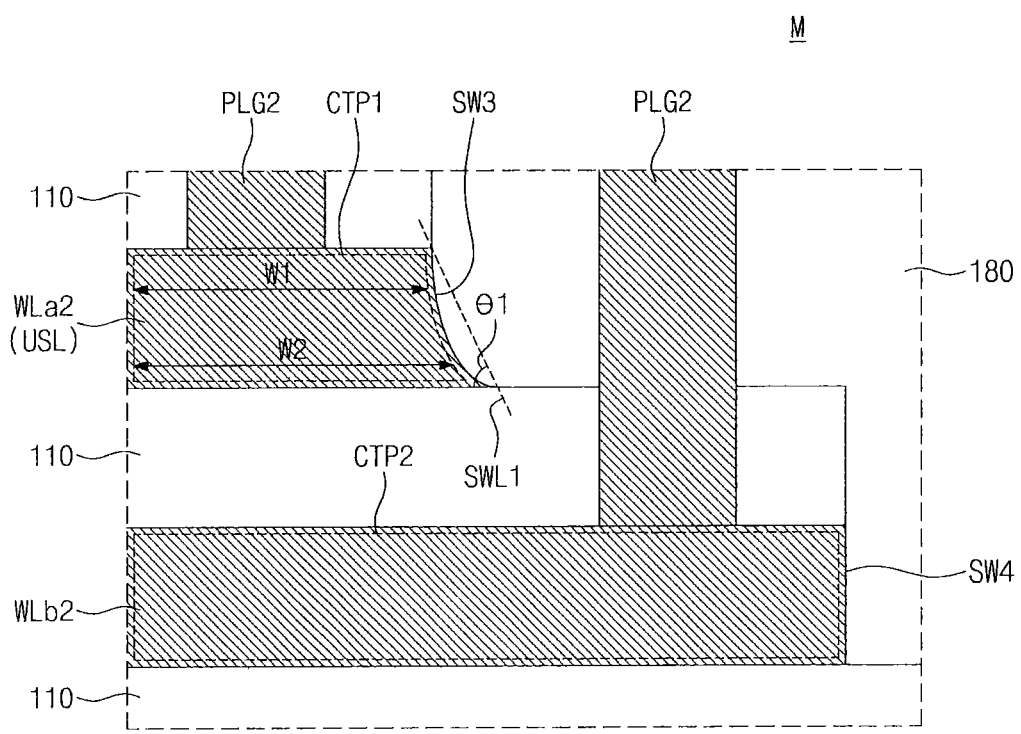
FIGS. 3B and 3C are enlarged views of a region 'M' of FIG. 3A.
Figure 3C:
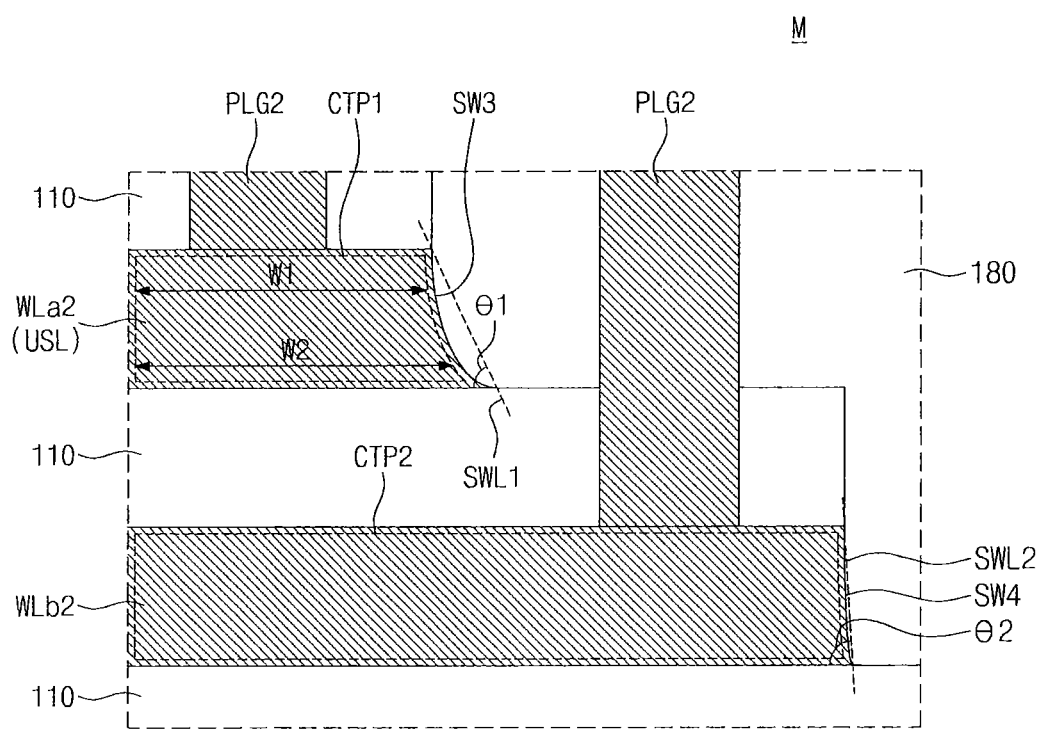

FIG. 2 is a plan view illustrating a 3D semiconductor memory device according to some embodiments of the inventive concepts. FIG. 3A is a cross-sectional view taken along a line I-I' of FIG. 2 to illustrate a 3D semiconductor memory device according to some embodiments of the inventive concepts. FIGS. 3B and 3C are enlarged views of a region 'M' of FIG. 3A.

Referring to FIGS. 2 and 3A, a substrate 100 may be provided. The substrate 100 may be, for example, a silicon substrate, a germanium substrate, or a silicon-germanium substrate. The substrate 100 may include common source regions CSL doped with dopants. In some embodiments, the common source regions CSL may have linear shapes extending in a second direction D2 parallel to a top surface of the substrate 100. The common source regions CSL may be arranged along a first direction D1 intersecting the second direction D2.

Stack structures ST may be disposed on the substrate 100. Each of the stack structures ST may include insulating layers 110 and gate electrodes WLb1, WLa1, WLb2, and WLa2 which are alternately and repeatedly stacked on the substrate 100. A lower portion of each of the stack structures ST may be defined as a first stack structure ST1, and an upper portion of each of the stack structures ST may be defined as a second stack structure ST2. In other words, the second stack structure ST2 may be disposed on the underlying first stack structure ST1. The first stack structure ST1 may include first gate electrodes WLb1 and WLa1, and the second stack structure ST2 may include second gate electrodes WLb2 and WLa2. The stack structures ST may have linear shapes extending in the second direction D2 and may be arranged along the first direction D1 when viewed from a plan view.

Each of the common source regions CSL may be disposed in the substrate 100 between the stack structures ST adjacent to each other. A lower insulating layer 105 may be disposed between the substrate 100 and the first stack structures ST1. In some embodiments, the lower insulating layer 105 may include a silicon oxide layer and/or a high-k dielectric layer (e.g., a silicon nitride layer, an aluminum oxide layer, or a hafnium oxide layer). The lower insulating layer 105 may be thinner than the insulating layers 110.

The gate electrodes WLb1, WLa1, WLb2, and WLa2 may be stacked along a third direction D3 perpendicular to the first and second directions D1 and D2. The gate electrodes WLb1, WLa1, WLb2, and WLa2 may be vertically spaced apart from each other by the insulating layers 110 disposed therebetween. The first gate electrodes WLb1 and WLa1 may include a first upper gate electrode WLa1 corresponding to the uppermost one of the first gate electrodes WLb1 and WLa1, and first lower gate electrodes WLb1 disposed under the first upper gate electrode WLa1. The lowermost one of the first lower gate electrodes WLb1 may be a lower selection line LSL. The second gate electrodes WLb2 and WLa2 may include a second upper gate electrode WLa2 corresponding to the uppermost one of the second gate electrodes WLb2 and WLa2, and second lower gate electrodes WLb2 disposed under the second upper gate electrode WLa2. The second upper gate electrodes WLa2 may be an upper selection line USL. For example, the gate electrodes WLb1, WLa1, WLb2, and WLa2 may include doped silicon, a metal (e.g., tungsten), a metal nitride, a metal silicide, or any combination thereof. For example, each of the insulating layers 110 may include a silicon oxide layer.

The lower selection line LSL may be used as the gate electrode of the ground selection transistor GST described with reference to FIG. 1. The upper selection line USL may be used as the gate electrode of the string selection transistor SST described with reference to FIG. 1. The gate electrodes WLb1, WLa1, and WLb2 except the lower and upper selection lines LSL and USL may be used as the gate electrodes of the memory cell transistors MCT described with reference to FIG. 1.

The substrate 100 may include a cell array region CAR, a first contact region CTR1, and a second contact region CTR2. At least one end portion of the stack structure ST may be disposed on the substrate 100 of the first and second contact regions CTR1 and CTR2. One end portion of the first stack structure ST1 may be disposed on the substrate 100 of the first contact region CTR1, and one end portion of the second stack structure ST2 may be disposed on the substrate 100 of the second contact region CTR2. In some embodiments, the second contact region CTR2 may be adjacent to the cell array region CAR. The first contact region CTR1 may be spaced apart from the cell array region CAR with the second contact region CTR2 interposed therebetween when viewed from a plan view. The cell array region CAR, the second contact region CTR2, and the first contact region CTR1 may be arranged in the second direction D2. The first stack structure ST1 may extend from the cell array region CAR into the first contact region CTR1 through the second contact region CTR2, and the second stack structure ST2 may extend from the cell array region CAR into the second contact region CTR2.

To electrically connect the gate electrodes WLb1, WLa1, WLb2, and WLa2 to a peripheral logic structure, each of the stack structures ST may have a stepwise structure on the substrate 100 of the first and second contact regions CTR1 and CTR2. A vertical height of the stepwise structure of the first and second contact regions CTR1 and CTR2 may increase as a distance from the cell array region CAR decreases. In other words, the stack structure ST may have a sloped profile on the substrate 100 of the first and second contact regions CTR1 and CTR2.

Planar areas of the first gate electrodes WLb1 and WLa1 of the first contact region CTR1 may sequentially decrease as a distance from the top surface of the substrate 100 in the third direction D3 increases. Thus, the lower selection line LSL corresponding to the lowermost one of the first gate electrodes WLb1 and WLa1 may have the greatest planar area. Planar areas of the second gate electrodes WLb2 and WLa2 of the second contact region CTR2 may sequentially decrease as a distance from the top surface of the substrate 100 in the third direction D3 increases. Thus, the upper selection line USL corresponding to the uppermost one of the second gate electrodes WLb2 and WLa2 may have the smallest planar area.

A first interlayer insulating layer 180 may be disposed on the substrate 100 to cover at least portions of the stack structures ST. The first interlayer insulating layer 180 may have a planarized top surface and may cover the stepwise structures of the stack structures ST on the substrate 100 of the first and second contact regions CTR1 and CTR2. A second interlayer insulating layer 190 may be disposed on the first interlayer insulating layer 180 and the stack structures ST.

A plurality of channel structures may penetrate each of the stack structures ST disposed on the substrate 100 of the cell array region CAR. The plurality of channel structures may include a plurality of channel layers 135, respectively. In some embodiments, a plurality of channel holes CH may penetrate each of the stack structures ST disposed on the substrate 100 of the cell array region CAR, and the channel layers 135 may extend along inner sidewalls of the channel holes CH toward the substrate 100, respectively. The channel layers 135 may be electrically connected to the substrate 100. In some embodiments, the channel layers 135 may be in direct contact with the top surface of the substrate 100. The channel layers 135 penetrating each of the stack structures ST may be arranged along the second direction D2 when viewed from a plan view. In some embodiments, the channel layers 135 of each of the stack structures ST may be arranged in a line along the second direction D2. In some embodiments, the channel layers 135 of each of the stack structures ST may be arranged in a zigzag form along the second direction D2.

In some embodiments, the channel layer 135 may have a pipe or macaroni shape having an opened bottom end and an opened top end. In some embodiments, even though not shown in the drawings, the channel layer 135 may have a pipe or macaroni shape having a closed bottom end.

The channel layers 135 may be undoped or may be doped with dopants having the same conductivity type as the substrate 100. The channel layers 135 may include a semiconductor material having a poly-crystalline structure or a single-crystalline structure. For example, the channel layers 135 may include silicon. An inner space surrounded by the channel layer 135 may be filled with a filling insulation pattern 150. For example, the filling insulation pattern 150 may include silicon oxide.

A gate insulating layer 145 may be disposed between each of the channel layers 135 and the gate electrodes WLb1, WLa1, WLb2, and WLa2. In other words, the gate insulating layer 145 may directly cover the inner sidewall of the channel hole CH. The gate insulating layer 145 may extend in the third direction D3. The gate insulating layer 145 may have a pipe or macaroni shape of which top and bottom ends are opened.

The gate insulating layer 145 may include a single layer or a multi-layer including a plurality of layers. In some embodiments, the gate insulating layer 145 may include a tunnel insulating layer and a charge storage layer of a charge trap-type flash memory transistor. The tunnel insulating layer may include a material of which an energy band gap is greater than that of the charge storage layer. For example, the tunnel insulating layer may include at least one of a silicon oxide layer or a high-k dielectric layer (e.g., an aluminum oxide layer or a hafnium oxide layer). The charge storage layer may include at least one of a trap site-rich insulating layer (e.g., a silicon nitride layer), a floating gate electrode, or an insulating layer including conductive nanodots. The tunnel insulating layer may be in direct contact with the channel layer 135. Even though not shown in the drawings, a blocking insulating layer may be disposed between the charge storage layer and each of the gate electrodes WLb1, WLa1, WLb2, and WLa2. The blocking insulating layer may extend between each of the gate electrodes WLb1, WLa1, WLb2, and WLa2 and the insulating layers 110. The blocking insulating layer may include a material of which an energy band gap is smaller than that of the tunnel insulating layer and greater than that of the charge storage layer. For example, the blocking insulating layer may include at least one of a silicon oxide layer or a high-k dielectric layer (e.g., an aluminum oxide layer or a hafnium oxide layer).

In certain embodiments, the gate insulating layer 145 may include the tunnel insulating layer, the charge storage layer, and the blocking insulating layer. The tunnel insulating layer may be in direct contact with the channel layer 135, and the blocking insulating layer may be in direct contact with the gate electrodes WLb1, WLa1, WLb2, and WLa2. The charge storage layer may be disposed between the tunnel insulating layer and the blocking insulating layer. In this case, the gate electrodes WLb1, WLa1, WLb2, and WLa2 may be in direct contact with the insulating layers 110.

A filling insulation layer 170 may fill trenches TR, each of which is disposed between the stack structures ST adjacent to each other. The filling insulation layer 170 may include a silicon oxide layer.

A top end portion of each of the channel layers 135 may include a drain region DR. A conductive pad 160 may be in contact with the drain region DR of each of the channel layers 135. The second interlayer insulating layer 190 may cover the conductive pads 160. Bit line plugs BPLG may penetrate the second interlayer insulating layer 190 so as to be electrically connected to the conductive pads 160, respectively. Bit lines BL may be disposed on the bit line plugs BPLG. The bit lines BL may have linear shapes extending in the first direction D1. Each of the bit lines BL may be electrically connected to the conductive pads 160 arranged in the first direction D1 through the bit line plugs BPLG.

An interconnection structure for electrically connecting the gate electrodes WLb1, WLa1, WLb2, and WLa2 to the peripheral logic structure may be disposed on the stepwise structures of the stack structures ST disposed on the substrate 100 of the first and second contact regions CTR1 and CTR2.

In detail, first contact plugs PLG1 may penetrate the second and first interlayer insulating layers 190 and 180 so as to be respectively connected to end portions of the first gate electrodes WLb1 and WLa1 disposed on the substrate 100 of the first contact region CTR1. Second contact plugs PLG2 may penetrate the second and first interlayer insulating layers 190 and 180 so as to be respectively connected to end portions of the second gate electrodes WLb2 and WLa2 disposed on the substrate 100 of the second contact region CTR2. Vertical lengths of the first and second contact plugs PLG1 and PLG2 may sequentially decrease as a distance from the cell array region CAR decreases. Top surfaces of the first and second contact plugs PLG1 and PLG2 may be substantially coplanar with each other.

In addition, first connection lines CL1 may be disposed on the second interlayer insulating layer 190 of the first contact region CTR1 so as to be electrically connected to the first contact plugs PLG1. Second connection lines CL2 may be disposed on the second interlayer insulating layer 190 of the second contact region CTR2 so as to be electrically connected to the second contact plugs PLG2.

Referring to FIGS. 3A and 3B, an end of the first upper gate electrode WLa1 of the first contact region CTR1 may have a first sidewall SW1. The end of the first upper gate electrode WLa1 may be adjacent to the first contact plug PLG1 connected to the first upper gate electrode WLa1. Ends of the first lower gate electrodes WLb1 of the first contact region CTR1 may have second sidewalls SW2, respectively. The first sidewall SW1 may have a gentle slope, and each of the second sidewalls SW2 may have a vertical slope. Thus, the slope of the first sidewall SW1 may be gentler than that of each of the second sidewalls SW2.

An end of the second upper gate electrode WLa2 of the second contact region CTR2 may have a third sidewall SW3. Ends of the second lower gate electrodes WLb2 of the second contact region CTR2 may have fourth sidewalls SW4, respectively. The third sidewall SW3 may have a gentle slope, and each of the fourth sidewalls SW4 may have a vertical slope. Thus, the slope of the third sidewall SW3 may be gentler than that of each of the fourth sidewalls SW4. Meanwhile, the third sidewall SW3 may have the substantially same slope as the first sidewall SW1, as shown by FIGS. 3A-3B.

In detail, referring to FIG. 3B, the second upper gate electrode WLa2 may have a first pad portion CTP1 extending in the second direction D2 in the second contact region CTR2. The second contact plug PLG2 may be connected directly to the first pad portion CTP1. In the second contact region CT2, each of the second lower gate electrodes WLP2 may have a second pad portion CTP2 extending in the second direction D2 and the second contact plug PLG2 may be connected directly to the second pad portion CTP2.

A gradient of the third sidewall SW3 of the first pad portion CTP1 may have a first angle θ1. In some embodiments, a first line SWL1 that connects a top end and a bottom end of the third sidewall SW3 may be provided when viewed from a cross-sectional view taken along the second direction D2. The first angle θ1 may correspond to an angle between the first line SWL1 and a top surface of the insulating layer 110 disposed under the second upper gate electrode WLa2. The top surface of the insulating layer 110 may be substantially parallel to the top surface of the substrate 100. Here, the first angle θ1 may be smaller than 90 degrees. In some embodiments, the first angle θ1 may range from 30 degrees to 85 degrees. Meanwhile, the fourth sidewall SW4 of the second pad portion CTP2 may be substantially perpendicular to the top surface of the substrate 100. In other words, a gradient of the fourth sidewall SW4 may be about 90 degrees.

Since the first angle θ1 is smaller than 90 degrees, a length in the second direction D2 of the first pad portion CTP1 may become progressively greater from a top surface toward a bottom surface of the first pad portion CTP1. For example, an upper portion of the first pad portion CTP1 may have a first length W1 in the second direction D2, and a lower portion of the first pad portion CTP1 may have a second length W2 in the second direction D2. Here, the second length W2 may be greater than the first length W1.

In certain embodiments, as illustrated in FIG. 3C, a gradient of the fourth sidewall SW4 of the second pad portion CTP2 may have a second angle θ2. In some embodiments, a second line SWL2 that connects a top end and a bottom end of the fourth sidewall SW4 may be provided when viewed from a cross-sectional view taken along the second direction D2. The second angle θ2 may correspond to an angle between the second line SWL2 and a top surface of the insulating layer 110 disposed under the second lower gate electrode WLb2. Here, the second angle θ2 may be greater than the first angle θ1. In some embodiments, the second angle θ2 may range from 80 degrees to 90 degrees.

In some embodiments, the first upper gate electrode WLa1 may have a third pad portion in the first contact region CTR1, and each of the first lower gate electrodes WLb1 may have a fourth pad portion in the first contact region CTR1. Structural features of the third pad portion and the fourth pad portion may be the same or similar as the structural features of the first pad portion CTP1 and the second pad portion CTP2 described above with reference to FIGS. 3B and 3C.

FIGS. 4 to 26 are cross-sectional views taken along the line I-I' of FIG. 2 to illustrate a method for manufacturing a 3D semiconductor memory device, according to some embodiments of the inventive concepts. FIG. 27 is a cross-sectional view corresponding to the line I-I' of FIG. 2 to illustrate a manufacturing method for comparison with embodiments of the inventive concepts.

Figure 4:
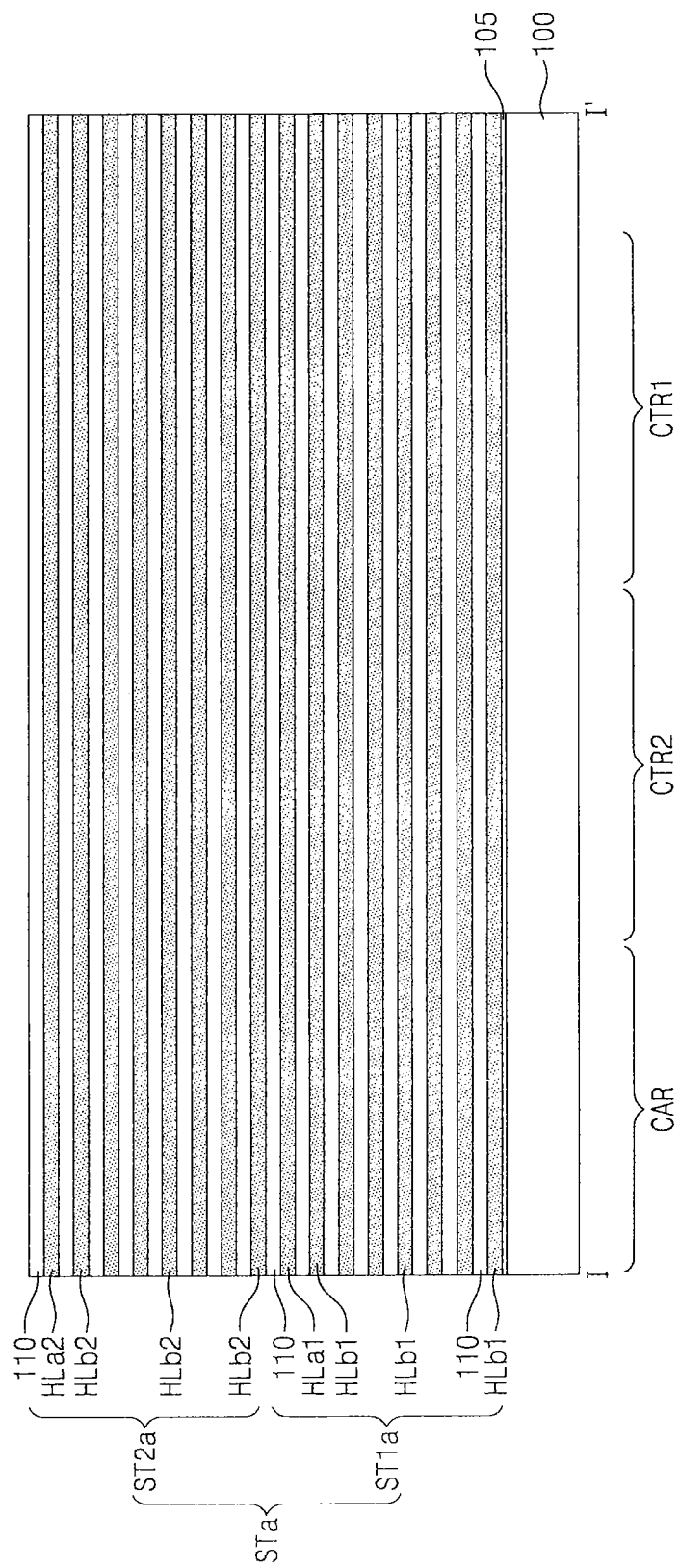
FIGS. 4 to 26 are cross-sectional views taken along the line I-I' of FIG. 2 to illustrate a method for manufacturing a 3D semiconductor memory device, according to some embodiments of the inventive concepts.

Referring to FIGS. 2 and 4, sacrificial layers HLb1, HLa1, HLb2, and HLa2 and insulating layers 110 may be alternately and repeatedly deposited on a substrate 100 to form a stack structure layer STa. The stack structure layer STa may include a first stack structure layer ST1a disposed on the substrate 100 and a second stack structure layer ST2a disposed on the first stack structure layer ST1a. The first stack structure layer ST1a may include first sacrificial layers HLb1 and HLa1, and the second stack structure layer ST2a may include second sacrificial layers HLb2 and HLa2.

The first sacrificial layers HLb1 and HLa1 may include a first upper sacrificial layer HLa1 corresponding to the uppermost one of the first sacrificial layers HLb1 and HLa1 and first lower sacrificial layers HLb1 disposed under the first upper sacrificial layer HLa1. The second sacrificial layers HLb2 and HLa2 may include a second upper sacrificial layer HLa2 corresponding to the uppermost one of the second sacrificial layers HLb2 and HLa2 and second lower sacrificial layers HLb2 disposed under the second upper sacrificial layer HLa2.

In some embodiments, the sacrificial layers HLb1, HLa1, HLb2, and HLa2 may have the same thickness. In some embodiments, the lowermost first lower sacrificial layer HLb1 and the second upper sacrificial layer HLa2 of the sacrificial layers HLb1, HLa1, HLb2, and HLa2 may be thicker than other sacrificial layers HLb1, HLa1, and HLb2 disposed therebetween. The insulating layers 110 may have the same thickness, or a thickness of one or some of the insulating layers 110 may be different from that of another or others of the insulating layers 110.

The sacrificial layers HLb1, HLa1, HLb2, and HLa2 and the insulating layers 110 may be deposited using a thermal chemical vapor deposition (thermal CVD) method, a plasma-enhanced CVD method, a physical CVD method, and/or an atomic layer deposition (ALD) method. For example, each of the sacrificial layers HLb1, HLa1, HLb2, and HLa2 may be formed of a silicon nitride layer, a silicon oxynitride layer, or a silicon layer. In some embodiments, the sacrificial layers HLb1, HLa1, HLb2, and HLa2 may include a poly-crystalline structure or a single-crystalline structure. For example, each of the insulating layers 110 may be formed of a silicon oxide layer.

In addition, a lower insulating layer 105 may be formed between the substrate 100 and the first stack structure layer ST1a. The lower insulating layer 105 may be formed of a material having an etch selectivity with respect to the sacrificial layers HLb1, HLa1, HLb2, and HLa2. In some embodiments, the lower insulating layer 105 may include a silicon oxide layer and/or a high-k dielectric layer (e.g., a silicon nitride layer, an aluminum oxide layer, or a hafnium oxide layer). The lower insulating layer 105 may be thinner than the sacrificial layers HLb1, HLa1, HLb2, and HLa2 and the insulating layers 110.

Figure 5:
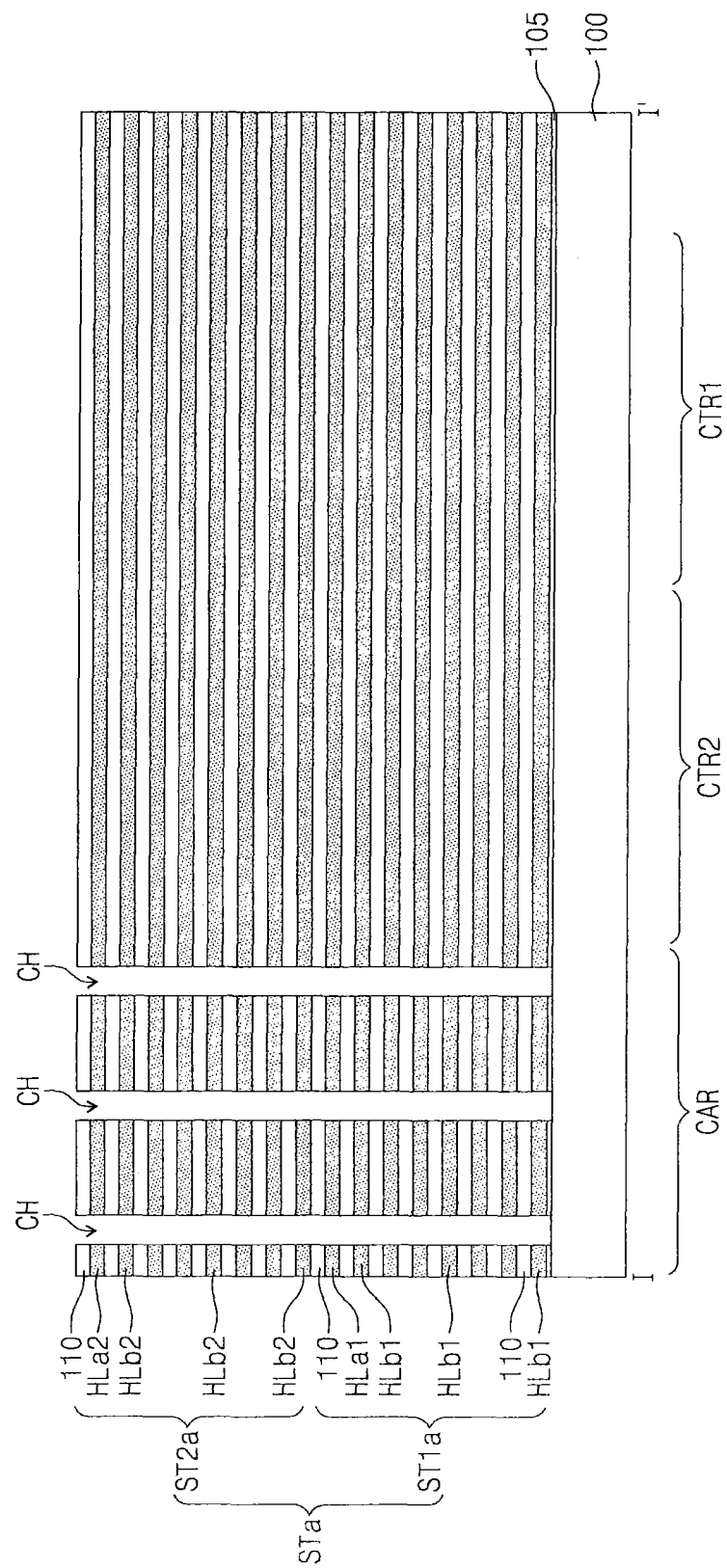

Referring to FIGS. 2 and 5, channel holes CH may be formed to penetrate the stack structure layer STa. The channel holes CH may expose the substrate 100. The channel holes CH may be arranged in the same form as the channel structures (i.e., the channel layers 135) described with reference to FIGS. 2 and 3A when viewed from a plan view.

The formation of the channel holes CH may include forming a mask pattern having openings on the stack structure layer STa, and etching the stack structure layer STa using the mask pattern as an etch mask. The openings of the mask pattern may define regions in which the channel holes CH are to be formed. Thereafter, the mask pattern may be removed. Meanwhile, the top surface of the substrate 100 under the channel holes CH may be recessed by over-etching of the process of etching the stack structure layer STa.

Figure 6:
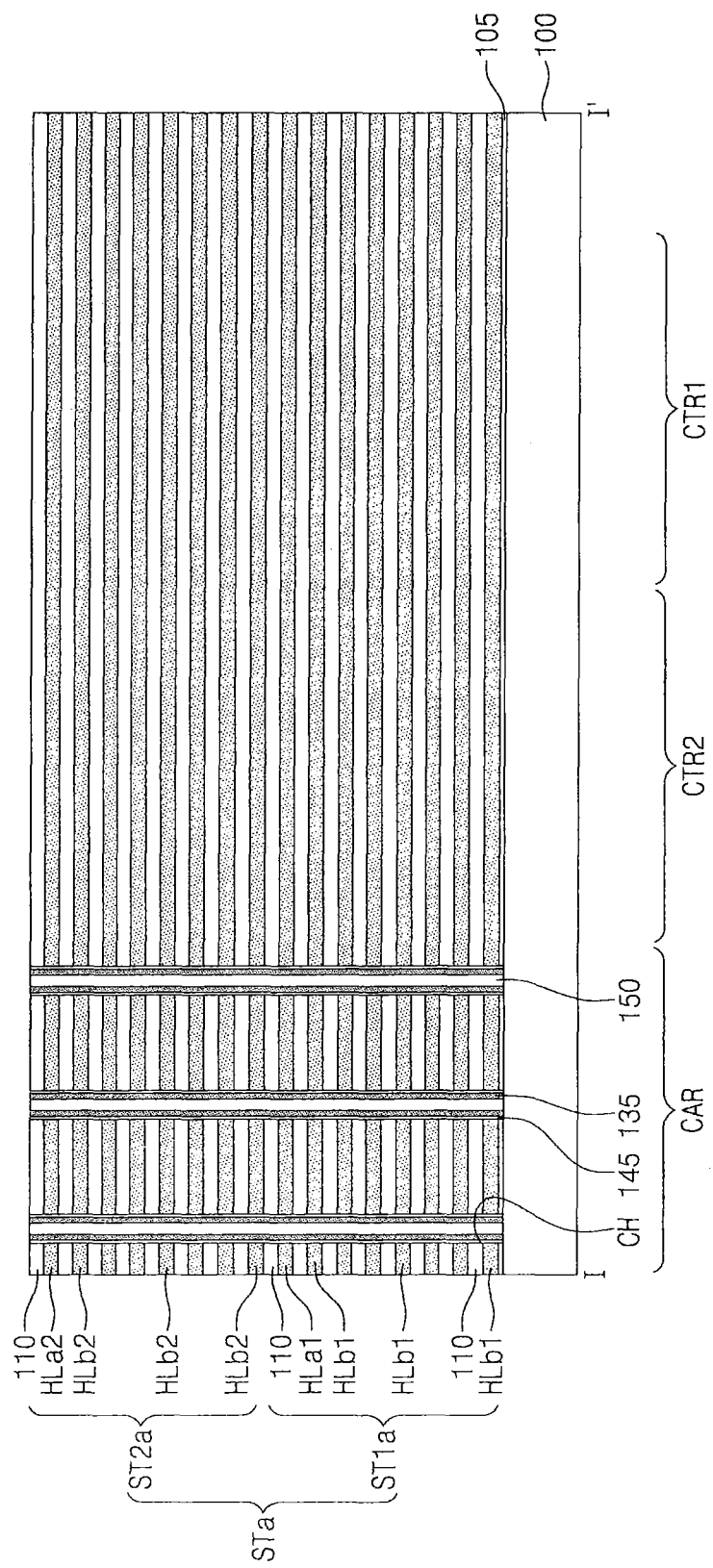

Referring to FIGS. 2 and 6, a gate insulating layer 145 and a channel layer 135 may be formed to sequentially cover an inner sidewall of each of the channel holes CH. In some embodiments, the gate insulating layer 145 may include a tunnel insulating layer and a charge storage layer. In some embodiments, the gate insulating layer 145 may further include a blocking insulating layer. In this case, the blocking insulating layer may be formed between the charge storage layer and the sacrificial layers HLb1, HLa1, HLb2, and HLa2. Each of the gate insulating layer 145 and the channel layer 135 may be formed using an ALD method or a CVD method. A filling insulation pattern 150 may be formed to completely fill each of the channel holes CH.

Figure 7:
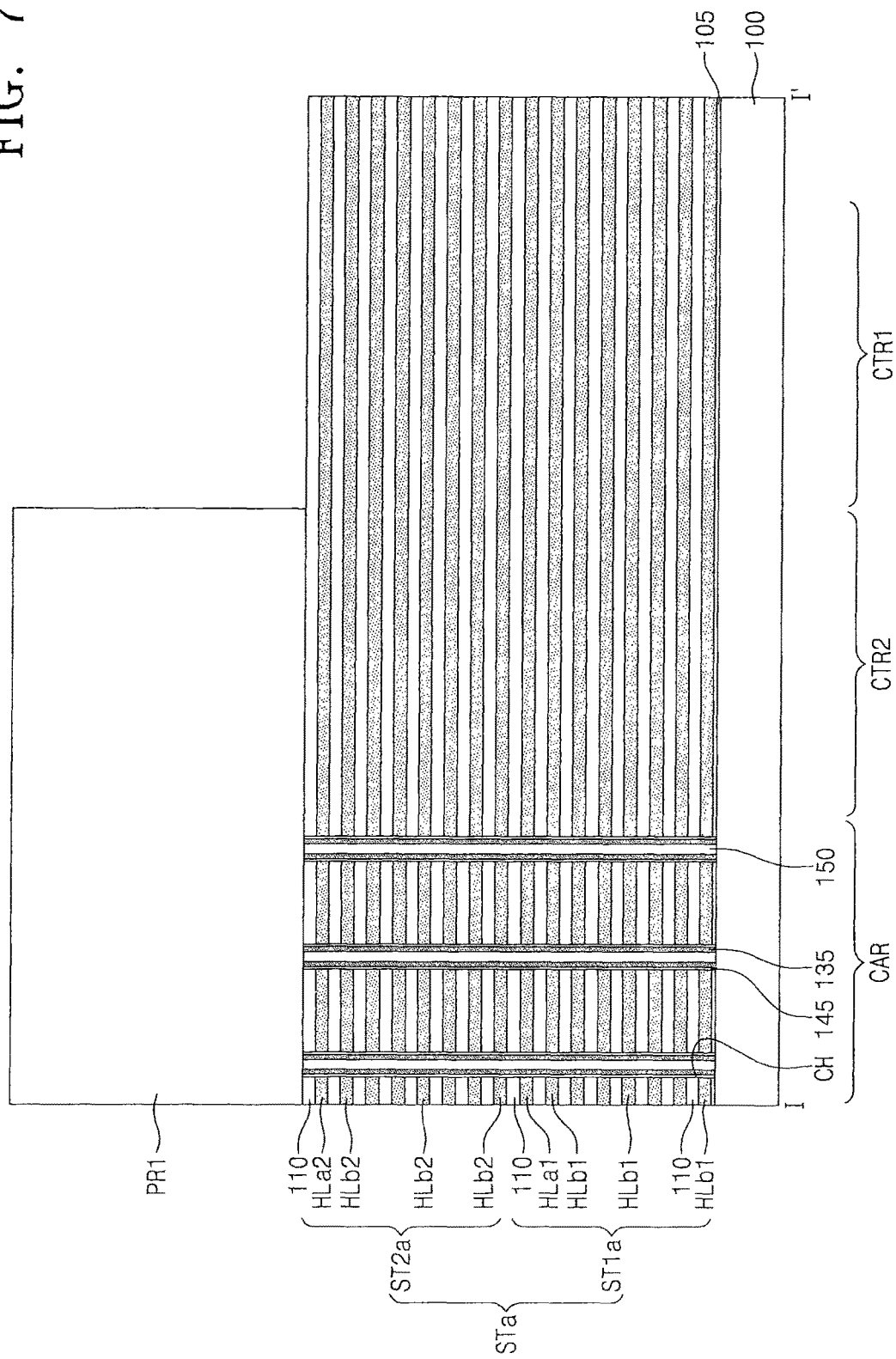

Referring to FIGS. 2 and 7, a first photoresist pattern PR1 may be formed on the second stack structure layer ST2a.

The substrate 100 may include a cell array region CAR, a first contact region CTR1, and a second contact region CTR2. The second contact region CTR2 may be adjacent to the cell array region CAR, and the first contact region CTR1 may be spaced apart from the cell array region CAR with the second contact region CTR2 interposed therebetween. The channel holes CH may penetrate the stack structure layer STa disposed on the substrate 100 of the cell array region CAR. The first photoresist pattern PR1 may be formed on the stack structure layer STa disposed on the substrate 100 of the cell array region CAR and the second contact region CTR2. The first photoresist pattern PR1 may expose the stack structure layer STa disposed on the substrate 100 of the first contact region CTR1.

Forming the first photoresist pattern PR1 may include preparing a photoresist composition, applying the photoresist composition to an entire top surface of the substrate 100 to form a photoresist layer, and performing an exposure process and a development process on the photoresist layer to form the first photoresist pattern PR1.

Figure 8:
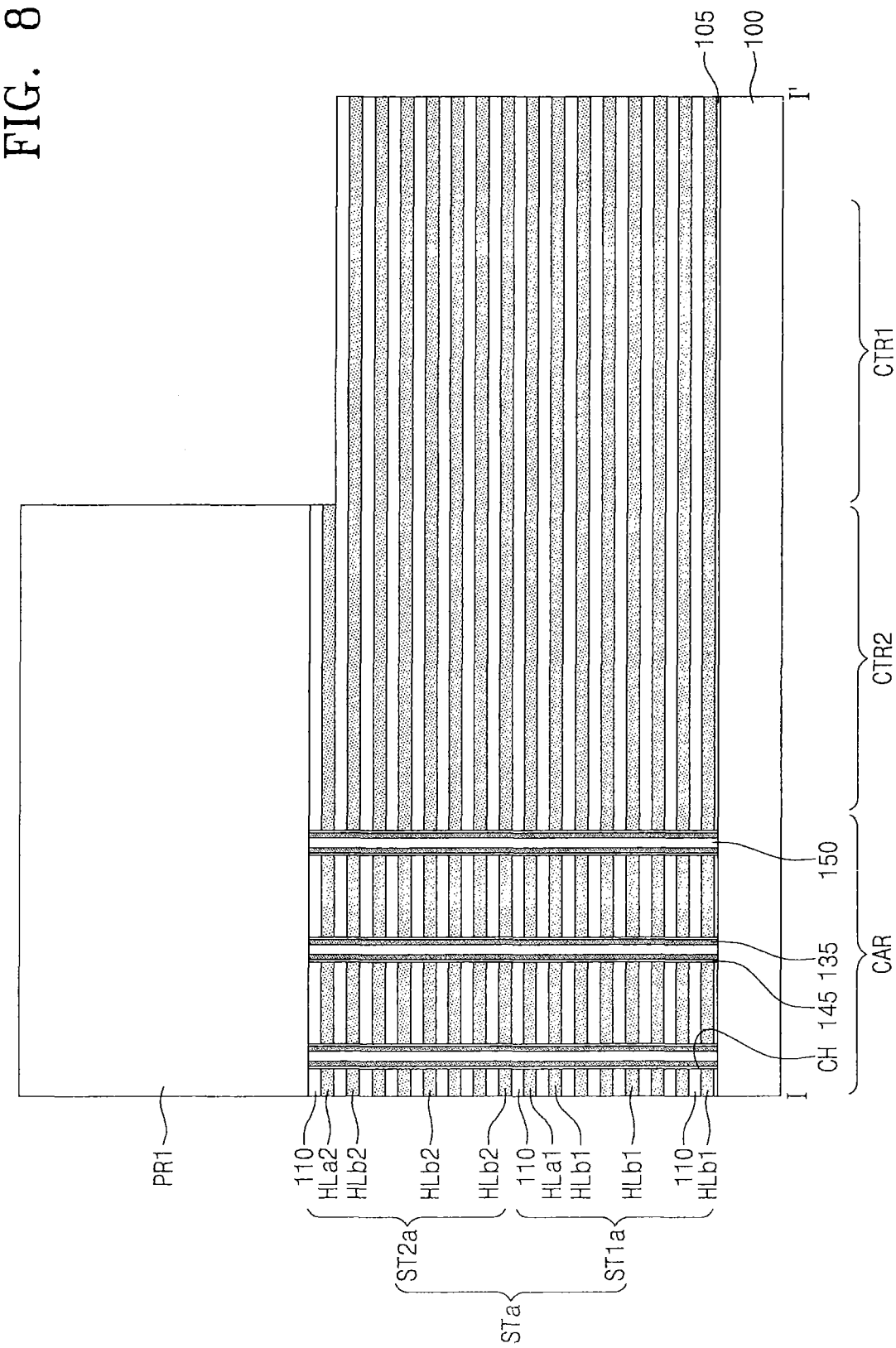

Referring to FIGS. 2 and 8, the uppermost insulating layer 110 and the second upper sacrificial layer HLa2 of the second stack structure layer ST2a may be sequentially etched using the first photoresist pattern PR1 as an etch mask. A process of etching the insulating layer 110 may be defined as a first etching process, and a process of etching the second upper sacrificial layer HLa2 may be defined as a second etching process. The first and second etching processes will be described later in detail. The etched insulating layer 110 and the etched second upper sacrificial layer HLa2 may expose another insulating layer 110 and the second lower sacrificial layer HLb2 disposed thereunder.

Figure 9:
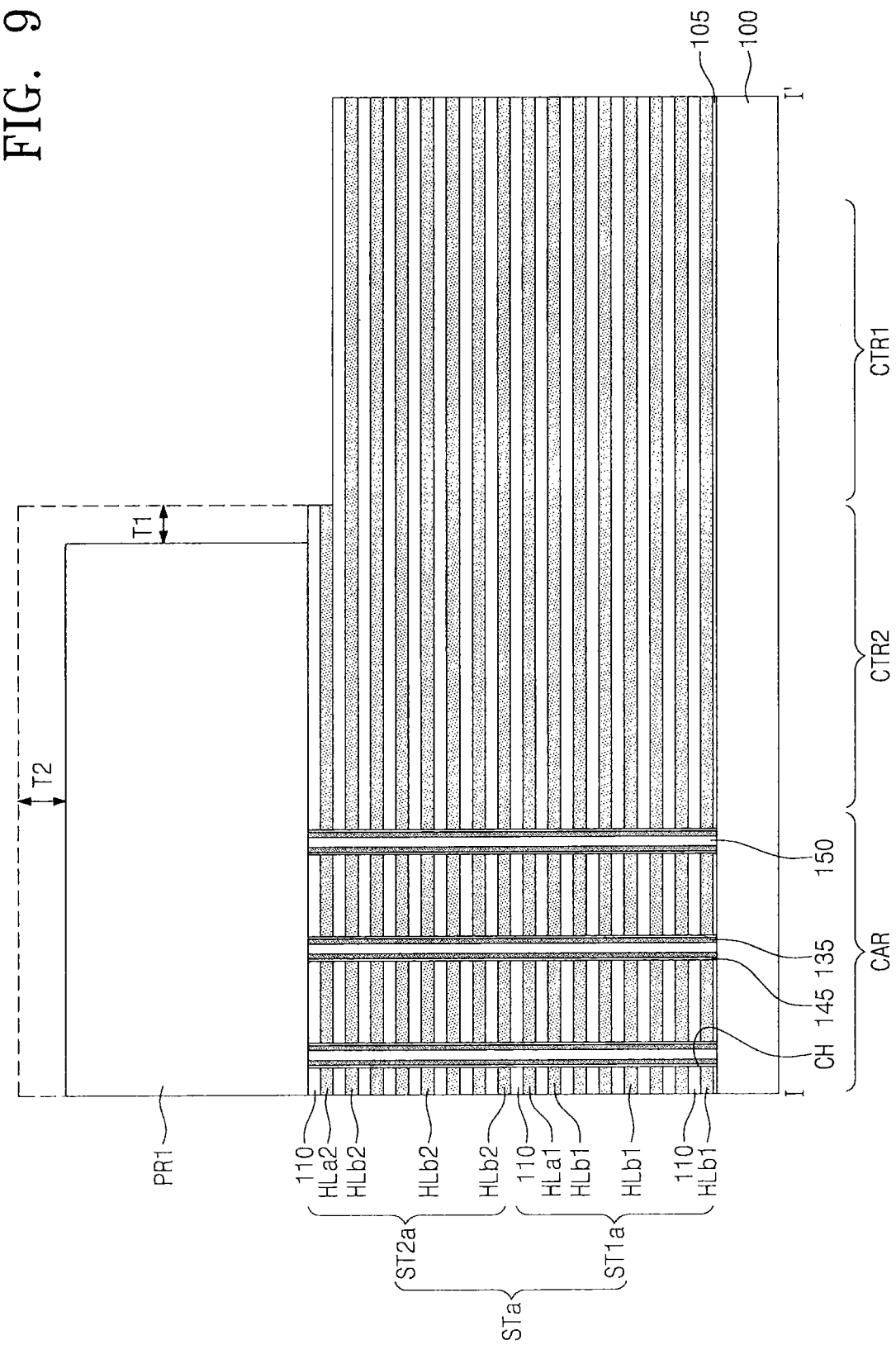

Referring to FIGS. 2 and 9, a trimming process may be performed on the first photoresist pattern PR1. In other word, an isotropic etching process may be performed on the first photoresist pattern PR1. Thus, a width and a height of the first photoresist pattern PR1 may be reduced. For example, during the trimming process, the width of the first photoresist pattern PR1 may be reduced by a first length T1 and the height of the first photoresist pattern PR1 may be reduced by a second length T2.

The trimming process may be performed by a wet etching process using an etching solution capable of selectively etching the first photoresist pattern PR1. By characteristics of the wet etching process, the reduced length of the height of the first photoresist pattern PR1 may be greater than the reduced length of the width of the first photoresist pattern PR1. This may be because an area of the exposed top surface of the first photoresist pattern PR1 is greater than that of the exposed sidewall of the first photoresist pattern PR1. Thus, the second length T2 may be greater than the first length T1 during the trimming process.

The processes described with reference to FIGS. 8 and 9 may constitute one cycle for forming a stepwise structure of the second stack structure layer ST2a of the second contact region CTR2. In other words, the cycle may include the process (i.e., the first etching process) of etching at least one insulating layer 110 exposed by the first photoresist pattern PR1, the process (i.e., the second etching process) of etching at least one second sacrificial layers HLb2 and HLa2 exposed by the at least one insulating layer 110, and the process of trimming the first photoresist pattern PR1 to reduce the width and the height of the first photoresist pattern PR1. The cycle may be repeatedly performed. The repetition of the cycle will be described hereinafter.

Figure 10:
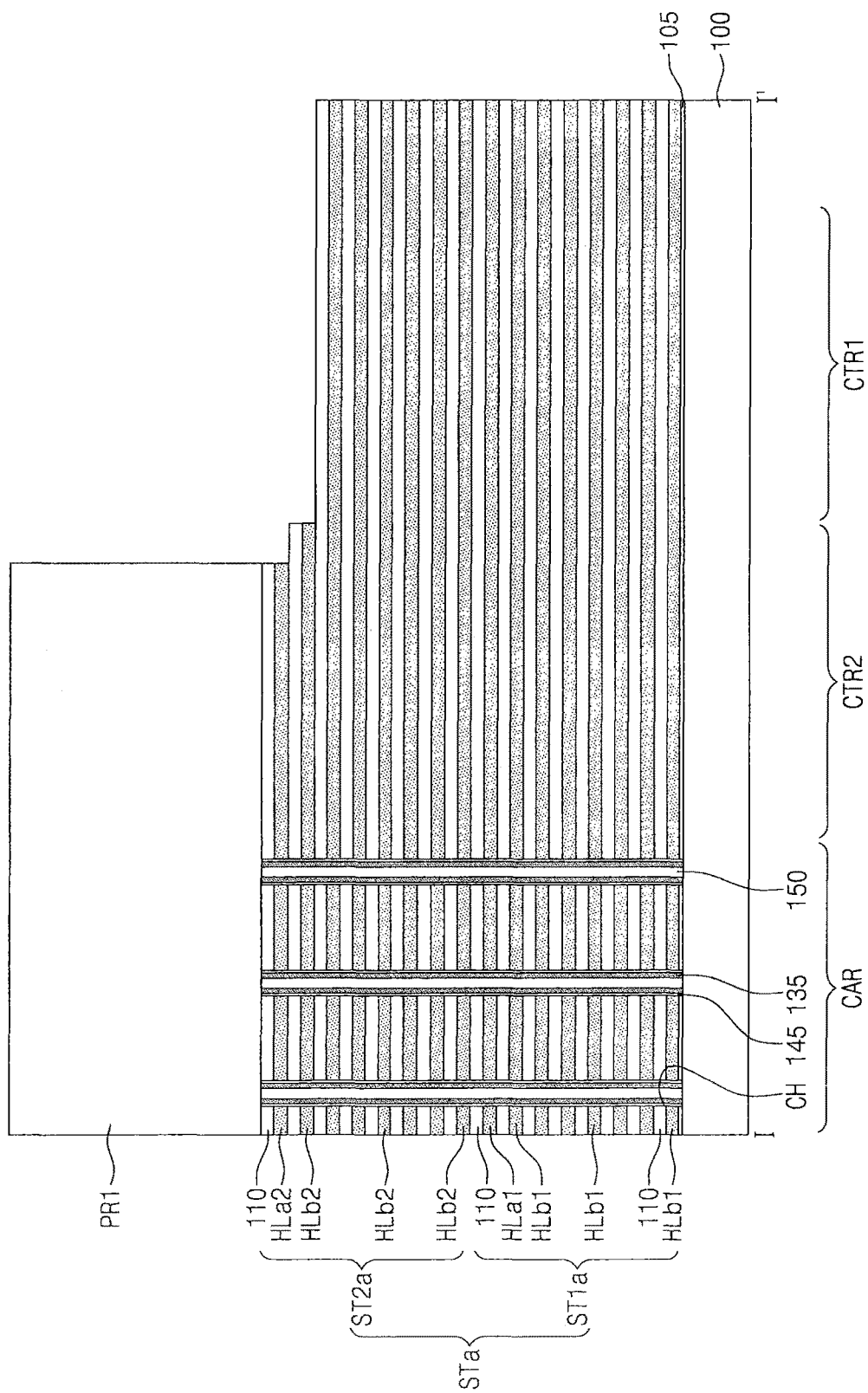

Referring to FIGS. 2 and 10, the uppermost insulating layer 110 may be etched using the first photoresist pattern PR1, the size of which is reduced once, as an etch mask. At the same time, an underlying insulating layer 110, which is exposed by the second upper sacrificial layer HLa2, may be etched together with the uppermost insulating layer 110 (the first etching process). Subsequently, the second upper sacrificial layer HLa2 may be etched using the first photoresist pattern PR1 as an etch mask. At the same time, an underlying second lower sacrificial layer HLb2, which is exposed by the second upper sacrificial layer HLa2, may be etched together with the second upper sacrificial layer HLa2 (the second etching process). The etched insulating layers 110 and the etched second upper and lower sacrificial layers HLa2 and HLb2 may expose another insulating layer 110 and another second lower sacrificial layer HLb2 disposed thereunder.

Figure 11:
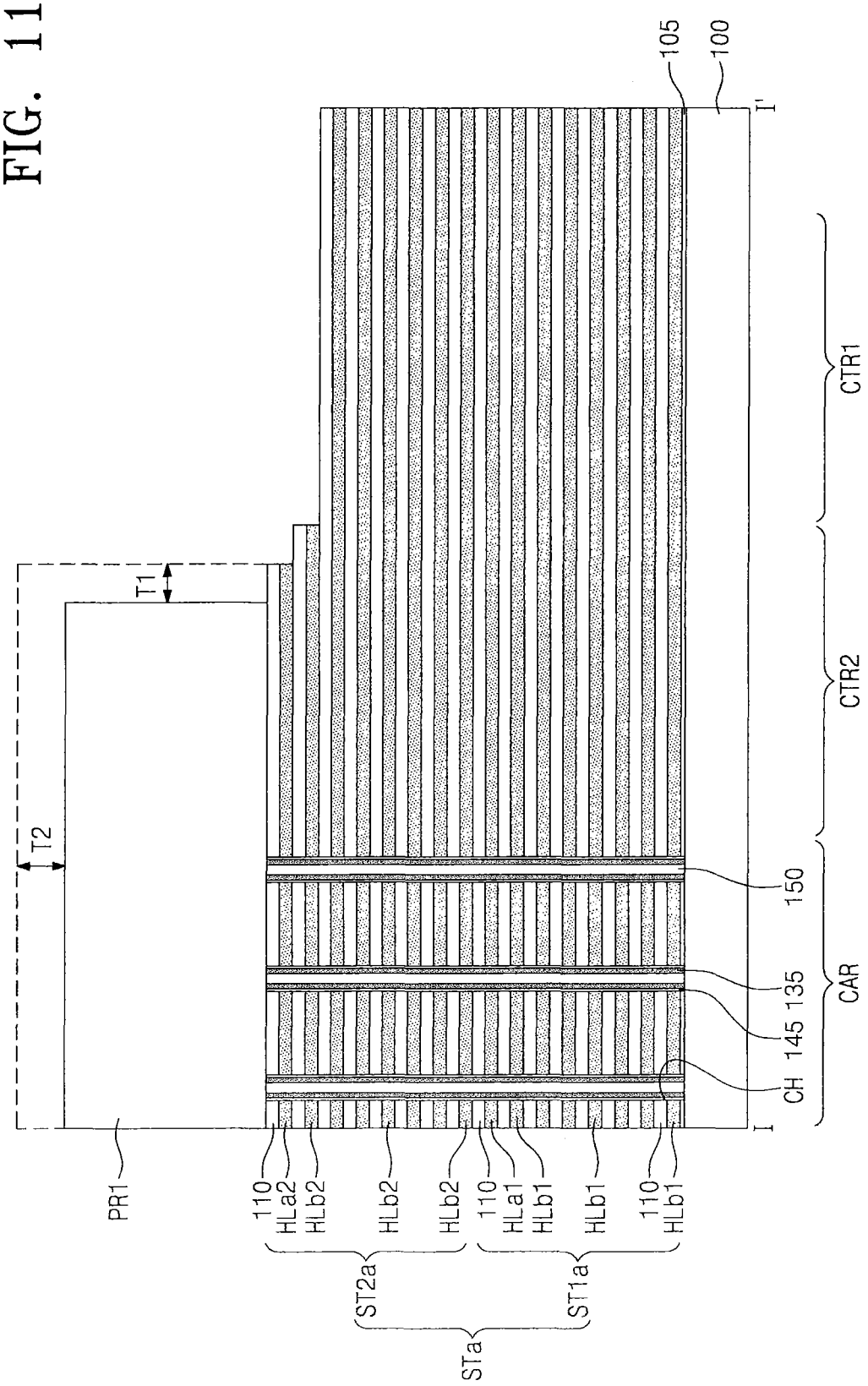

Referring to FIGS. 2 and 11, the trimming process may be performed again on the first photoresist pattern PR1. During the trimming process, the width of the first photoresist pattern PR1 may be reduced by the first length T1 and the height of the first photoresist pattern PR1 may be reduced by the second length T2. As a result, the cycle may be repeated once more.

Figure 12:
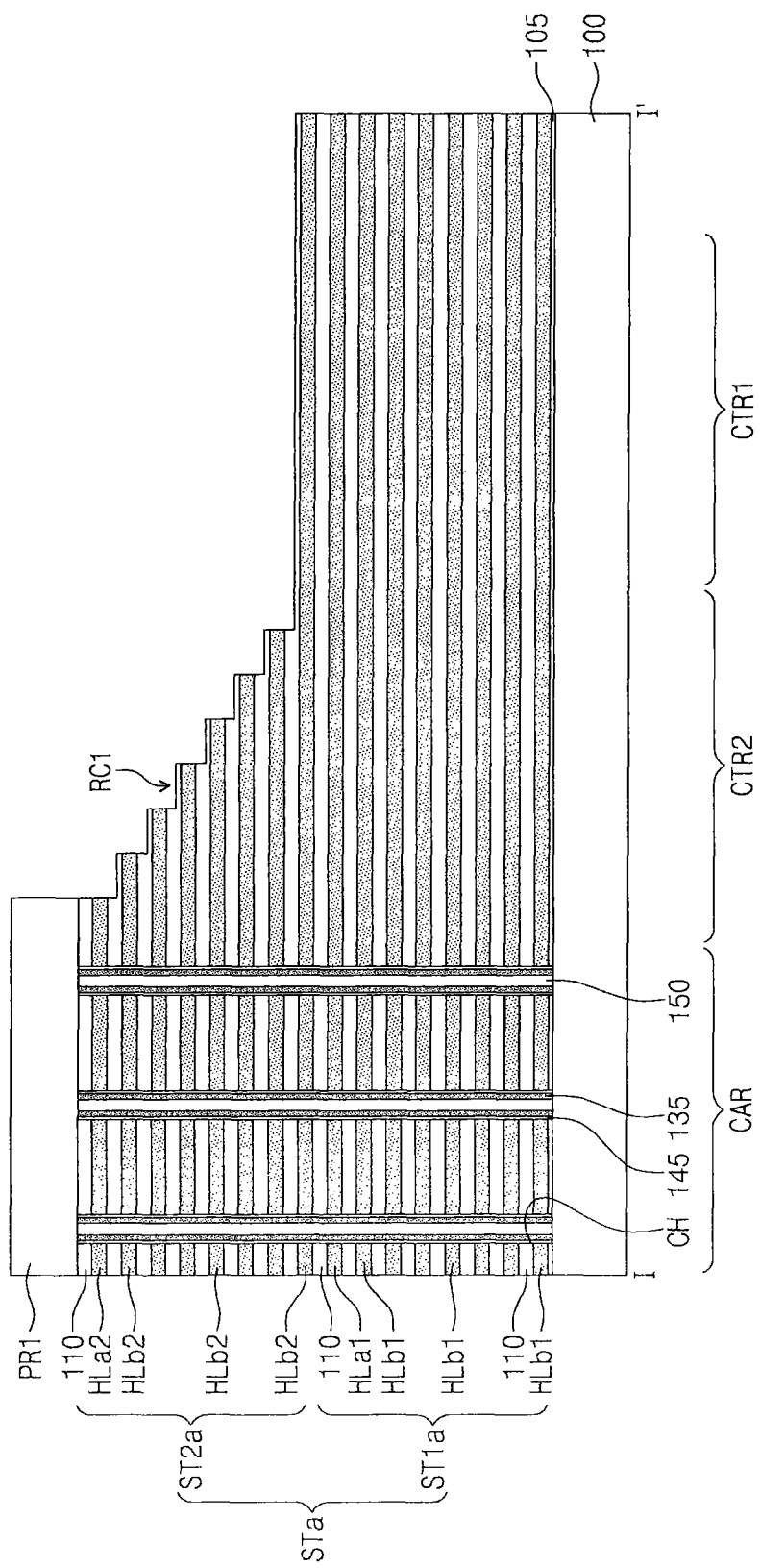

Referring to FIGS. 2 and 12, the cycle may be repeated such that an end portion of the second stack structure layer ST2a of the second contact region CTR2 may have the stepwise structure. In addition, the size of the first photoresist pattern PR1 may be reduced by the repeated trimming processes.

Meanwhile, the first etching process of the insulating layers 110 and the second etching process of the second sacrificial layers HLb2 and HLa2 of the cycle may be repeatedly performed, and thus upper portions of the insulating layers 110 exposed by the first photoresist pattern PR1 may be over-etched. Thus, first recesses RC1 may be formed in upper portions of the exposed insulating layers 110, respectively.

Figure 13:
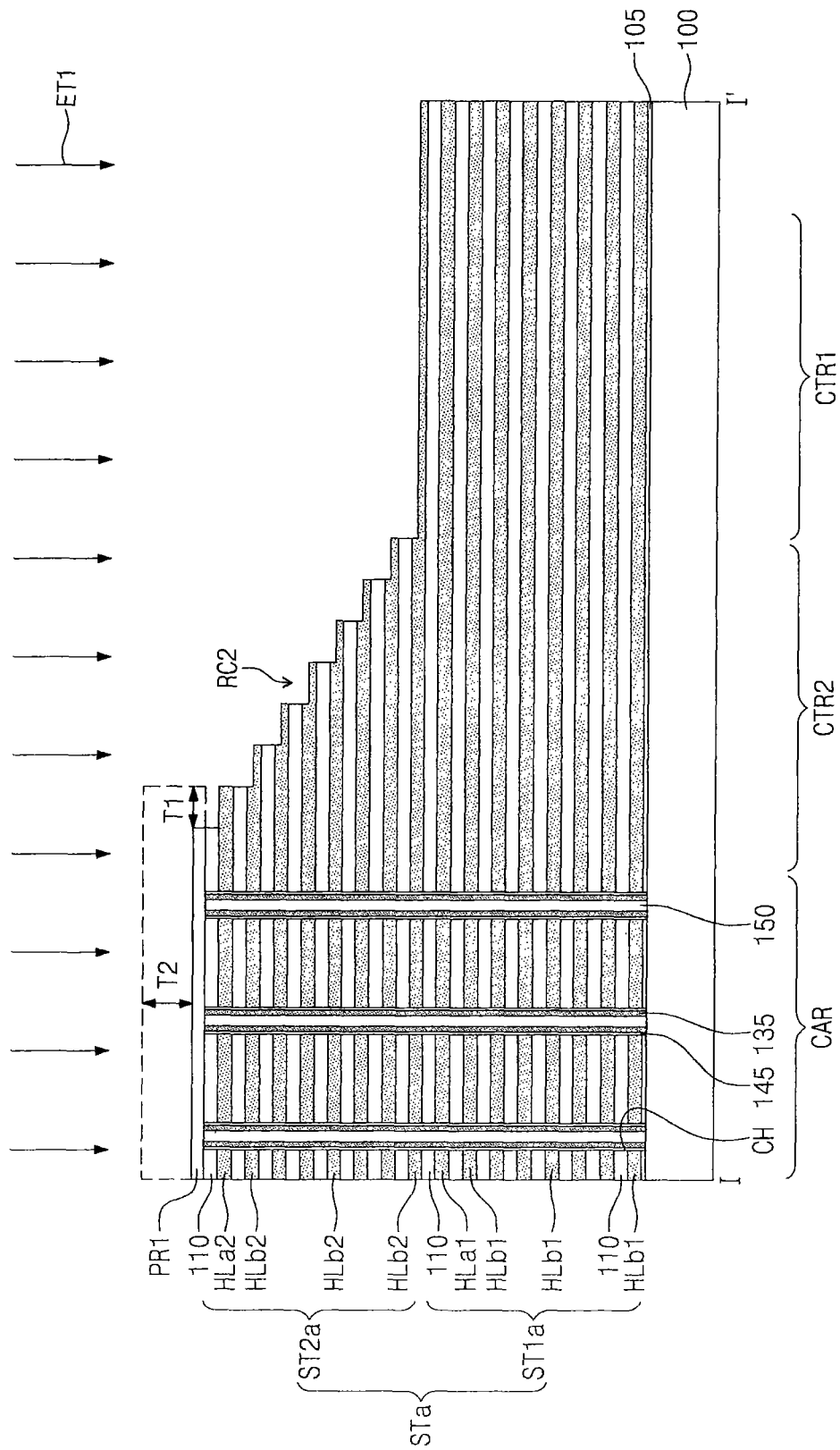

Referring to FIGS. 2 and 13, the trimming process may be performed using the first photoresist pattern PR1. Thereafter, the first etching process ET1 may be performed on the insulating layers 110 exposed by the first photoresist pattern PR1. During the first etching process ET1, the insulating layers 110 thinned by the first recesses RC1 may be rapidly removed and then upper portions of the second lower sacrificial layers HLb2 disposed thereunder may be etched by over-etching. Thus, second recesses RC2 may be formed in upper portions of the second lower sacrificial layers HLb2, respectively.

If the second etching process ET2 is performed on the structure illustrated in FIG. 13 immediately after the first etching process ET1, a process problem may occur. This problem will be described hereinafter. Referring to FIGS. 2 and 27, the second etching process ET2 of etching the second sacrificial layers HLb2 and HLa2 exposed by the first photoresist pattern PR1 may be performed.

The second etching process ET2 may be performed by a plasma dry etching process using an etching gas capable of etching the second sacrificial layers HLb2 and HLa2. For example, when the second sacrificial layers HLb2 and HLa2 are formed of silicon nitride or silicon oxynitride, the etching gas may include at least one etching component selected from a group consisting of $CH_3F$, $CH_2F_2$, $CF_4$, and $SF_6$. The etching component may etch silicon nitride and/or silicon oxynitride. In addition, the etching component may also etch silicon oxide (i.e., the insulating layers 110) of which a physical and chemical resistance is lower than that of silicon nitride. However, a ratio of the etching component in the etching gas may be adjusted to increase a difference between an etch rate of the second sacrificial layers HLb2 and HLa2 and an etch rate of the insulating layers 110.

However, during the second etching process ET2, the second lower sacrificial layers HLb2 thinned by the second recesses RC2 may be rapidly removed and then the insulating layers 110 disposed thereunder may also be removed. This is because the etching gas of the second etching process ET2 also etches the insulating layers 110 as described above. In addition, upper portions of the second lower sacrificial layers HLb2 disposed under the removed insulating layers 110 may be etched by over-etching of the second etching process ET2, and thus third recesses RC3 may be in the upper portions of the second lower sacrificial layers HLb2, respectively. Furthermore, the third recess RC3 may also be formed in an upper portion of the first upper sacrificial layer HLa1 of the first contact region CTR1.

In some embodiments, if the cycle is performed in the same way as before, the insulating layers 110 for protecting the second lower sacrificial layers HLb2 may not remain but may be removed. In addition, the third recesses RC3 may be formed in the second lower sacrificial layers HLb2 disposed under the removed insulating layers 110. In this case, when the second lower sacrificial layers HLb2 are replaced with second lower gate electrodes WLb2, the second lower gate electrodes WLb2 may not be normally formed in the second contact region CTR2.

Furthermore, if the cycle is performed in the same way as before, the insulating layer 110 disposed directly on the first upper sacrificial layer HLa1 may not remain but may be removed to expose the first upper sacrificial layer HLa1. In this case, another cycle to be described may not be normally performed, and thus a stepwise structure may not be normally formed in the first contact region CTR1.

Figure 14:
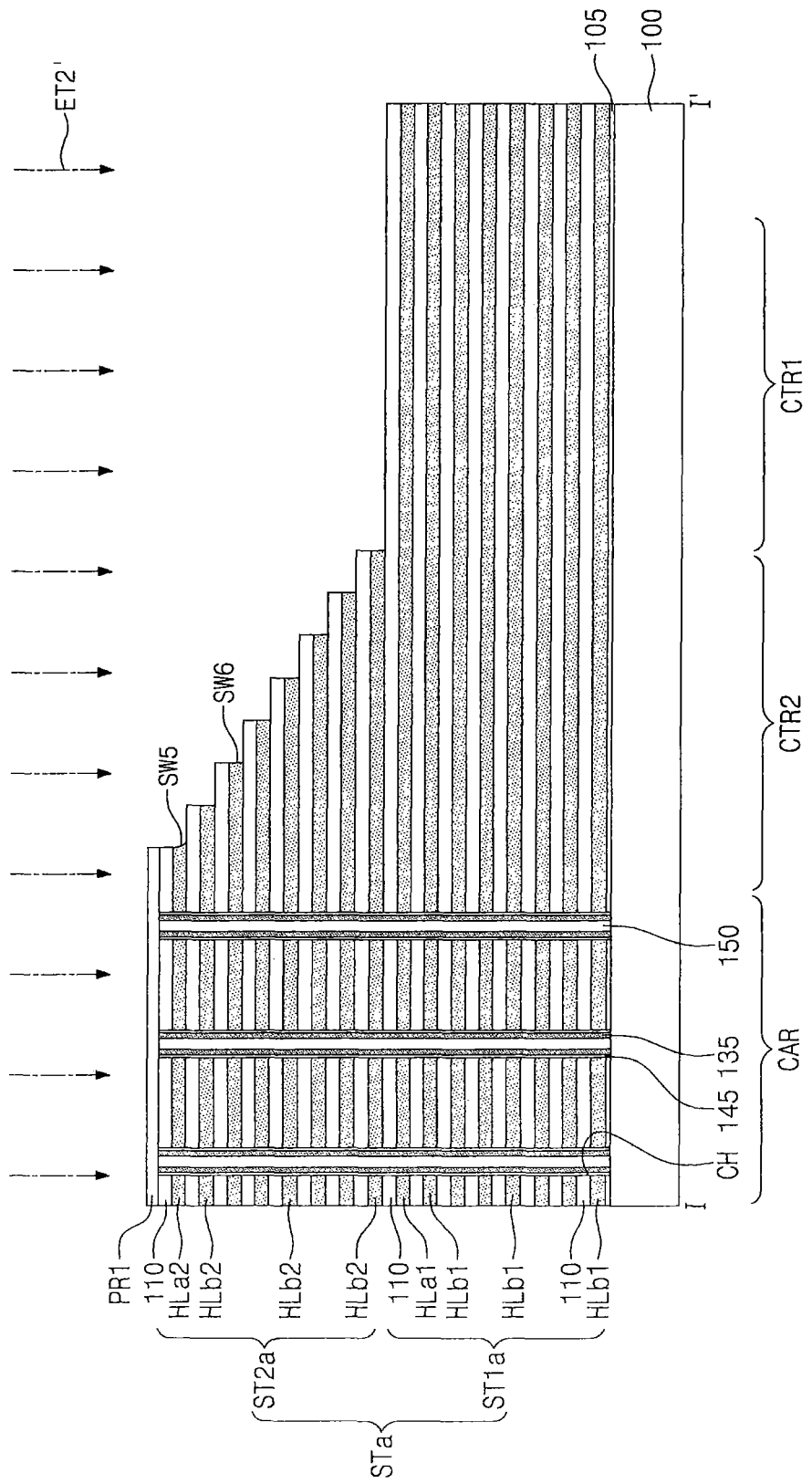

According to some embodiments of the inventive concepts, the second etching process ET2 of the last cycle may be replaced with a changed second etching process ET2'. Referring to FIGS. 2 and 14, the changed second etching process ET2' may be performed on the resultant structure of FIG. 13. In other words, the second sacrificial layers HLb2 and HLa2 exposed by the first photoresist pattern PR1 may be selectively etched.

An etch rate of the second sacrificial layers HLb2 and HLa2 by the changed second etching process ET2' may be lower than the etch rate of the second sacrificial layers HLb2 and HLa2 by the second etching process ET2 described with reference to FIG. 27. In some embodiments, the changed second etching process ET2' may be performed by a plasma dry etching process using an etching gas, and the etching gas may include at least one etching component selected from a group consisting of $CH_3F$, $CH_2F_2$, $CF_4$, and $SF_6$. However, unlike the second etching process ET2, a ratio of the etching component in the etching gas may be reduced but a ratio of another component in the etching gas may be increased in the changed second etching process ET2'. Thus, the etch rate of the second sacrificial layers HLb2 and HLa2 may be reduced during the changed second etching process ET2'. As a result, a time necessary for the changed second etching process ET2' may be longer than a time necessary for the second etching process ET2, and an etching straight property (i.e., etching anisotropy) of the changed second etching process ET2' may be weaker than that of the second etching process ET2. In other words, efficiency of the changed second etching process ET2' may be lower than that of the second etching process ET2. However, since an etch rate of a silicon oxide layer (i.e., the insulating layers 110) by the changed second etching process ET2' is much lower than the etch rate of the silicon oxide layer by the second etching process ET2, it is possible to increase a ratio of the etch rate of the second sacrificial layers HLb2 and HLa2 to the etch rate of the insulating layers 110.

Since the changed second etching process ET2' is performed, the second lower sacrificial layers HLb2 thinned by the second recesses RC2 may not be rapidly removed but may be slowly removed. In addition, since the ratio of the etch rate of the second sacrificial layers HLb2 and HLa2 to the etch rate of the insulating layers 110 is increased, it is possible to inhibit the insulating layers 110 disposed under the second lower sacrificial layers HLb2 from being etched. In other words, the insulating layers 110 may remain after the changed second etching process ET2'.

Since the etching straight property of the changed second etching process ET2' is weak, the second upper sacrificial layer HLa2 which has an initial thickness and is exposed may have a fifth sidewall SW5 having a gentle slope after the changed second etching process ET2'. On the other hand, since the exposed second lower sacrificial layers HLb2 have relatively thin thicknesses, each of the second lower sacrificial layers HLb2 may have a sixth sidewall SW6 having a substantially vertical slope after the changed second etching process ET2'. In other words, the slope of the fifth sidewall SW5 may be gentler than that of each of the sixth sidewalls SW6.

As a result, according to some embodiments of the inventive concepts, the changed second etching process ET2' may be used in the last cycle, and thus it is possible to solve the process problem described with reference to FIG. 27. In other words, since the insulating layers 110 normally remain to protect the second lower sacrificial layers HLb2 disposed thereunder, second lower gate electrodes WLb2 may be normally formed on the substrate 100 of the second contact region CTR2 in a subsequent process. In addition, the problem that the first upper sacrificial layer HLa1 is exposed may be solved.

Figure 15:
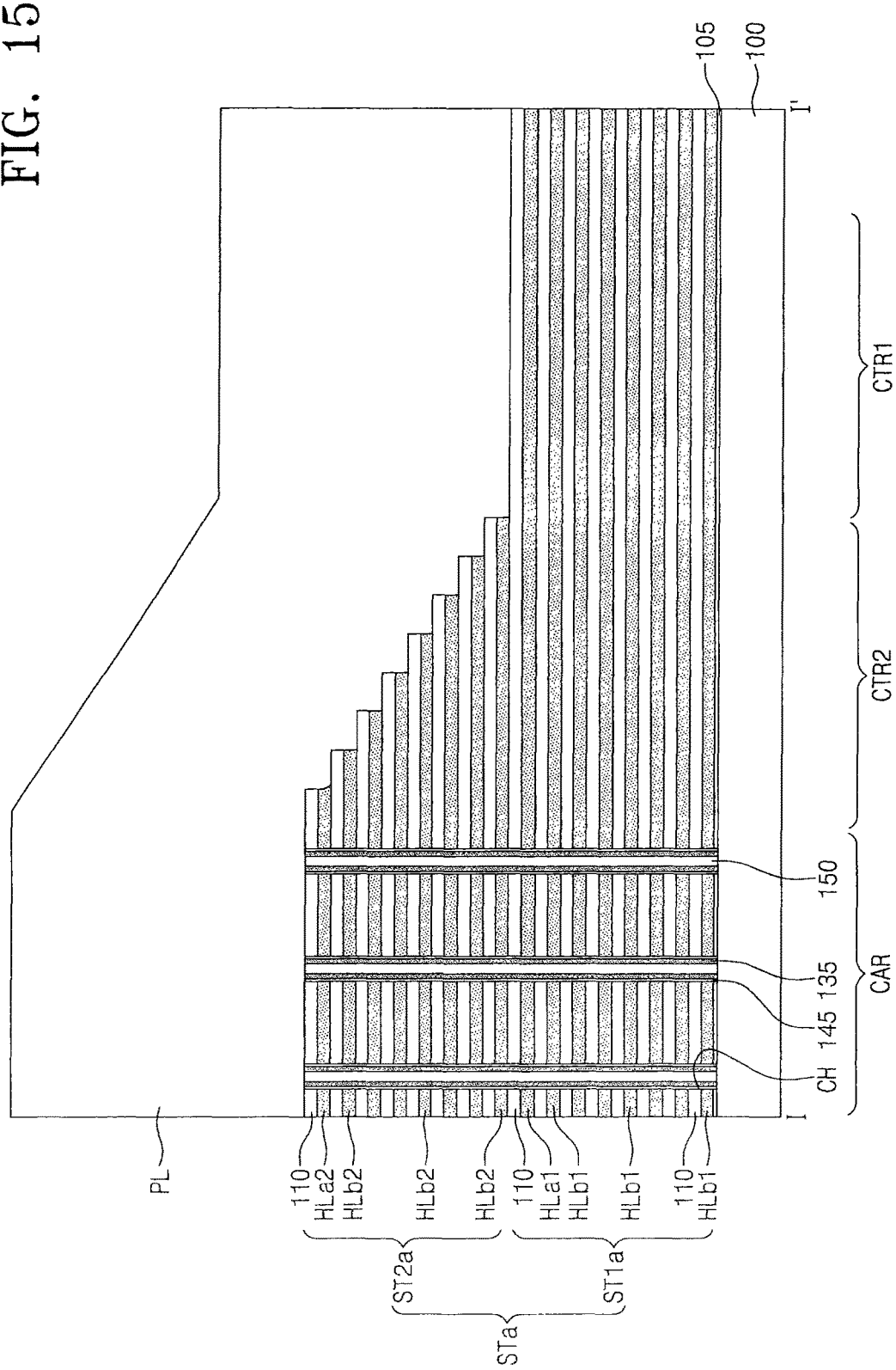

Referring to FIGS. 2 and 15, the first photoresist pattern PR1 may be removed, and then, a photoresist layer PL may be formed to cover the stack structure layer STa. The photoresist layer PL may be formed by coating an entire top surface of the substrate 100 with the photoresist composition described above. The photoresist layer PL may have a substantially uniform thickness, and thus a top surface of the photoresist layer PL of the second contact region CTR2 may be inclined.

Figure 16:
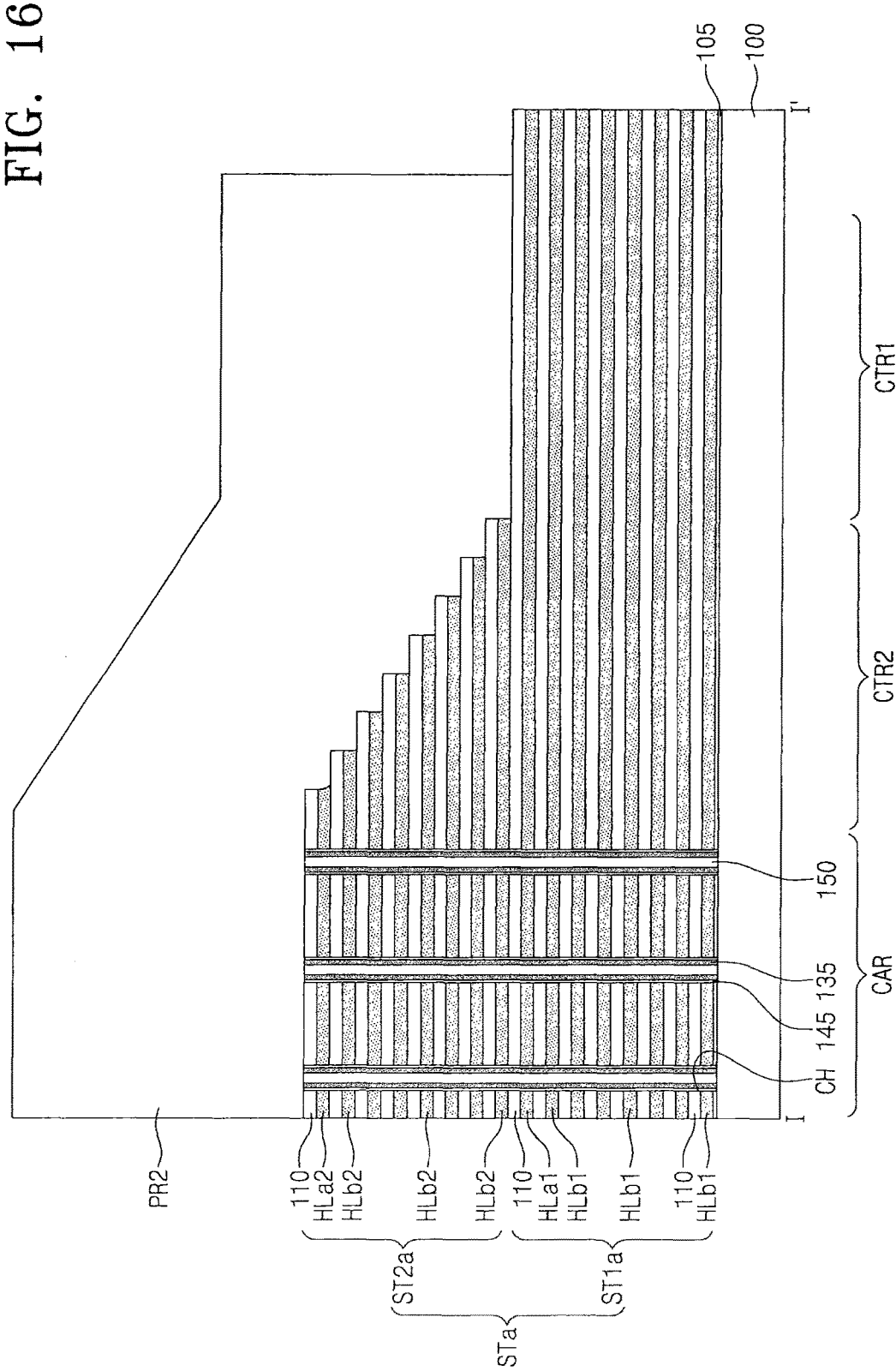

Referring to FIGS. 2 and 16, an exposure process and a development process may be performed on the photoresist layer PL to form a second photoresist pattern PR2. The second photoresist pattern PR2 may be formed on the stack structure layer STa of the cell array region CAR, the second contact region CTR2, and the first contact region CTR1. The second photoresist pattern PR2 may expose the insulating layers 110 and the first sacrificial layers HLb1 and HLa1 which are disposed outside the cell array region CAR, the second contact region CTR2, and the first contact region CTR1.

Figure 17:
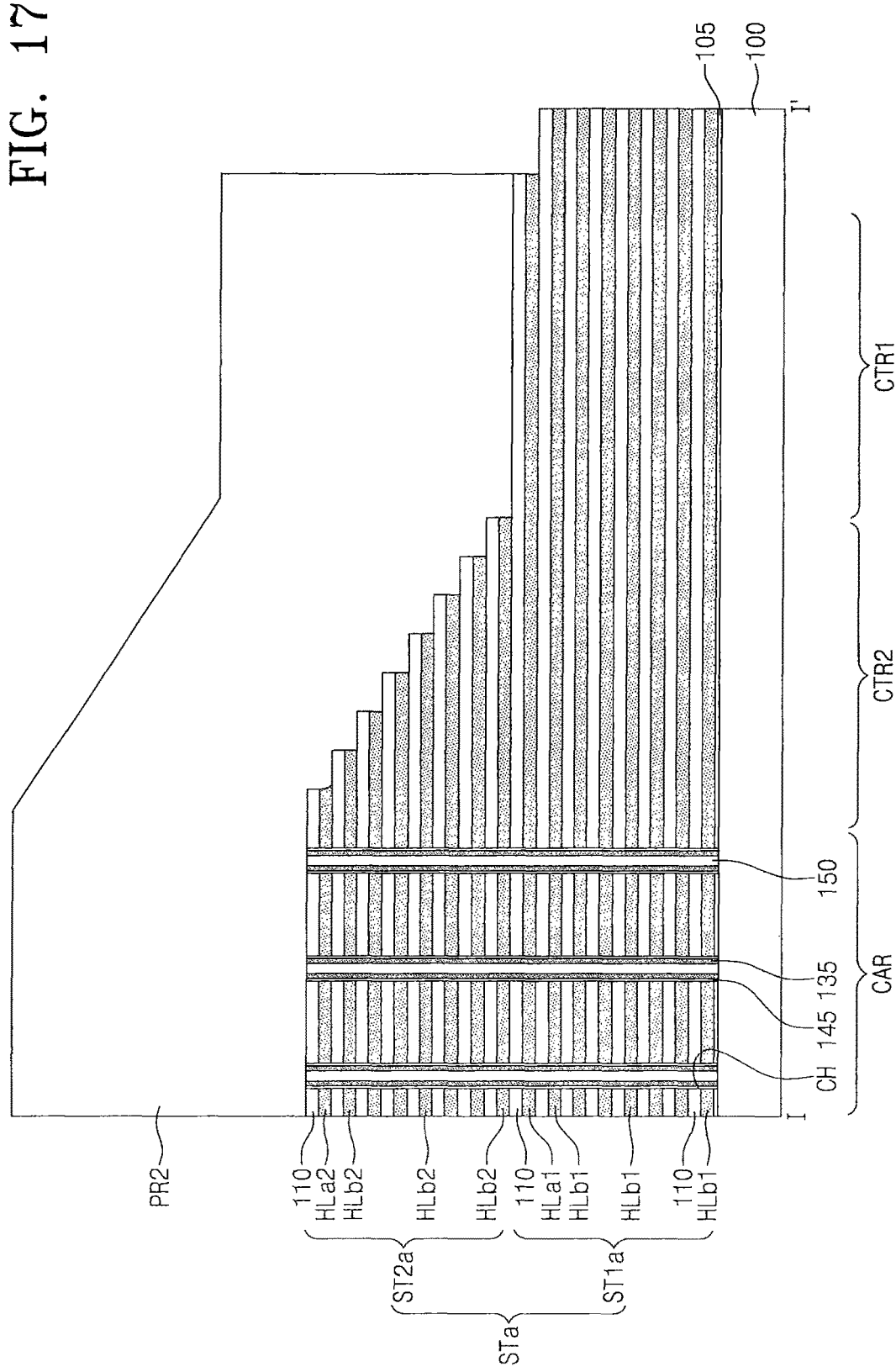

Referring to FIGS. 2 and 17, the uppermost insulating layer 110 and the first upper sacrificial layer HLa1 of the first stack structure layer ST1a may be sequentially etched using the second photoresist pattern PR2 as an etch mask. The etched insulating layer 110 and the etched first upper sacrificial layer HLa1 may expose another insulating layer 110 and the first lower sacrificial layer HLb1 disposed thereunder.

Figure 18:
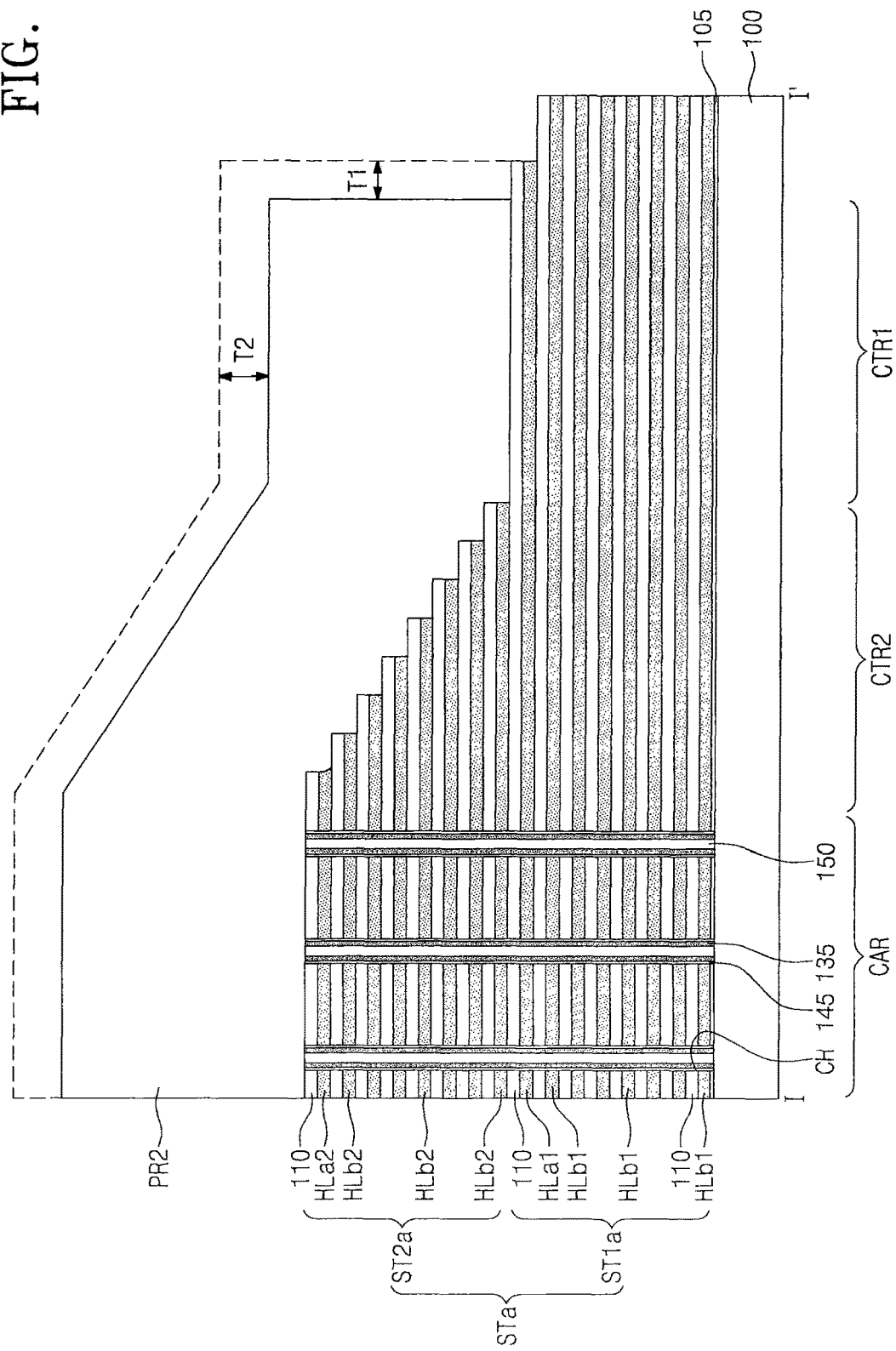

Referring to FIGS. 2 and 18, a trimming process may be performed on the second photoresist pattern PR2. During the trimming process, a width of the second photoresist pattern PR2 may be reduced by a first length T1 and a height of the second photoresist pattern PR2 may be reduced by a second length T2.

In other word, the processes described with reference to FIGS. 17 and 18 may be the same as the one cycle described with reference to FIGS. 8 and 9. Next, the cycle may be repeated.

Figure 19:
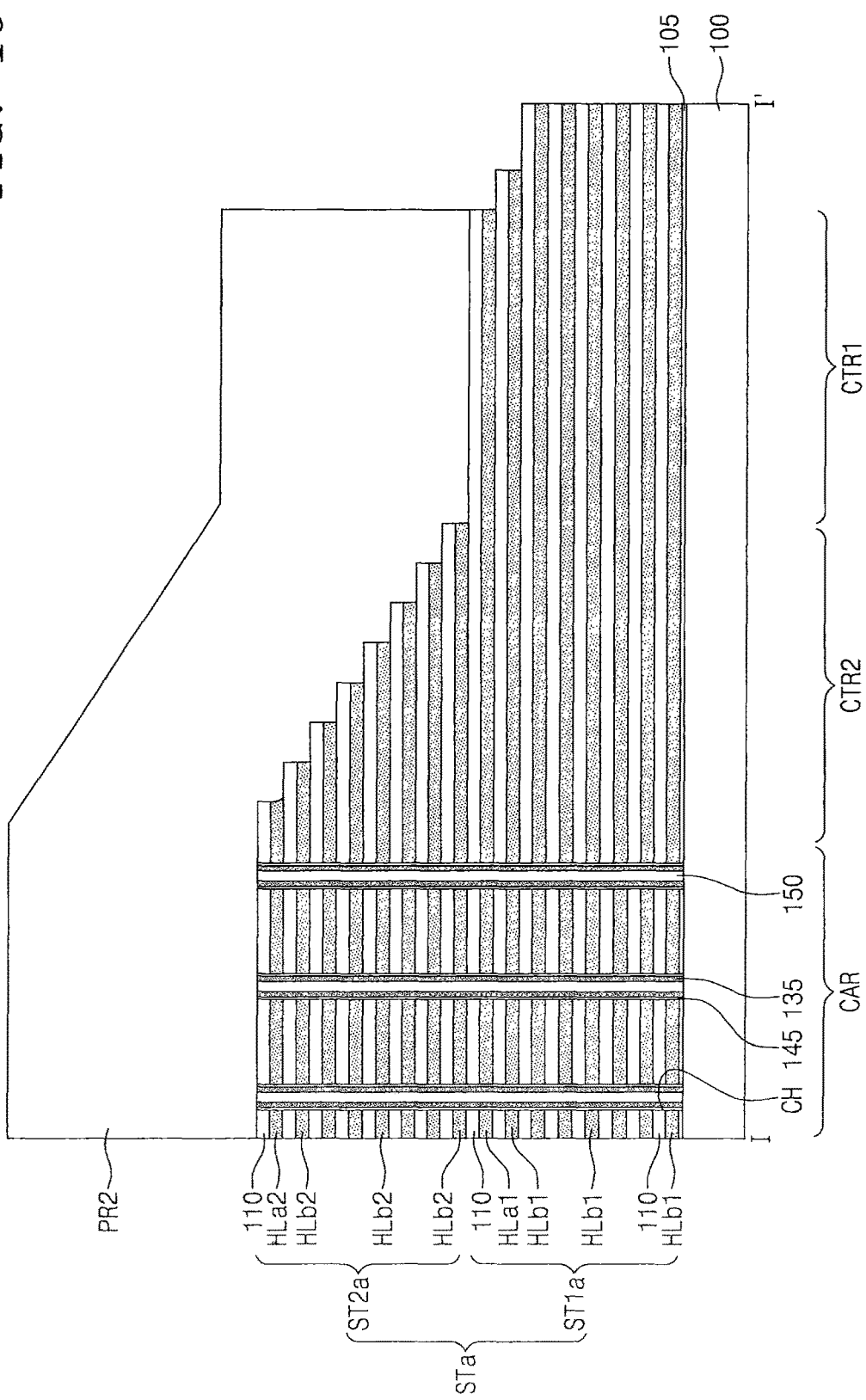

Referring to FIGS. 2 and 19, the uppermost insulating layer 110 of the first stack structure layer ST1a may be etched using the second photoresist pattern PR2, the size of which is reduced once, as an etch mask. At the same time, the insulating layer 110 exposed by and disposed under the first upper sacrificial layer HLa1 may also be etched (first etching process). Subsequently, the first upper sacrificial layer HLa1 may be etched using the second photoresist pattern PR2 as an etch mask. At the same time, the first lower sacrificial layer HLb1 exposed by and disposed under the uppermost first upper sacrificial layer HLa1 may also be etched (second etching process).

Figure 20:
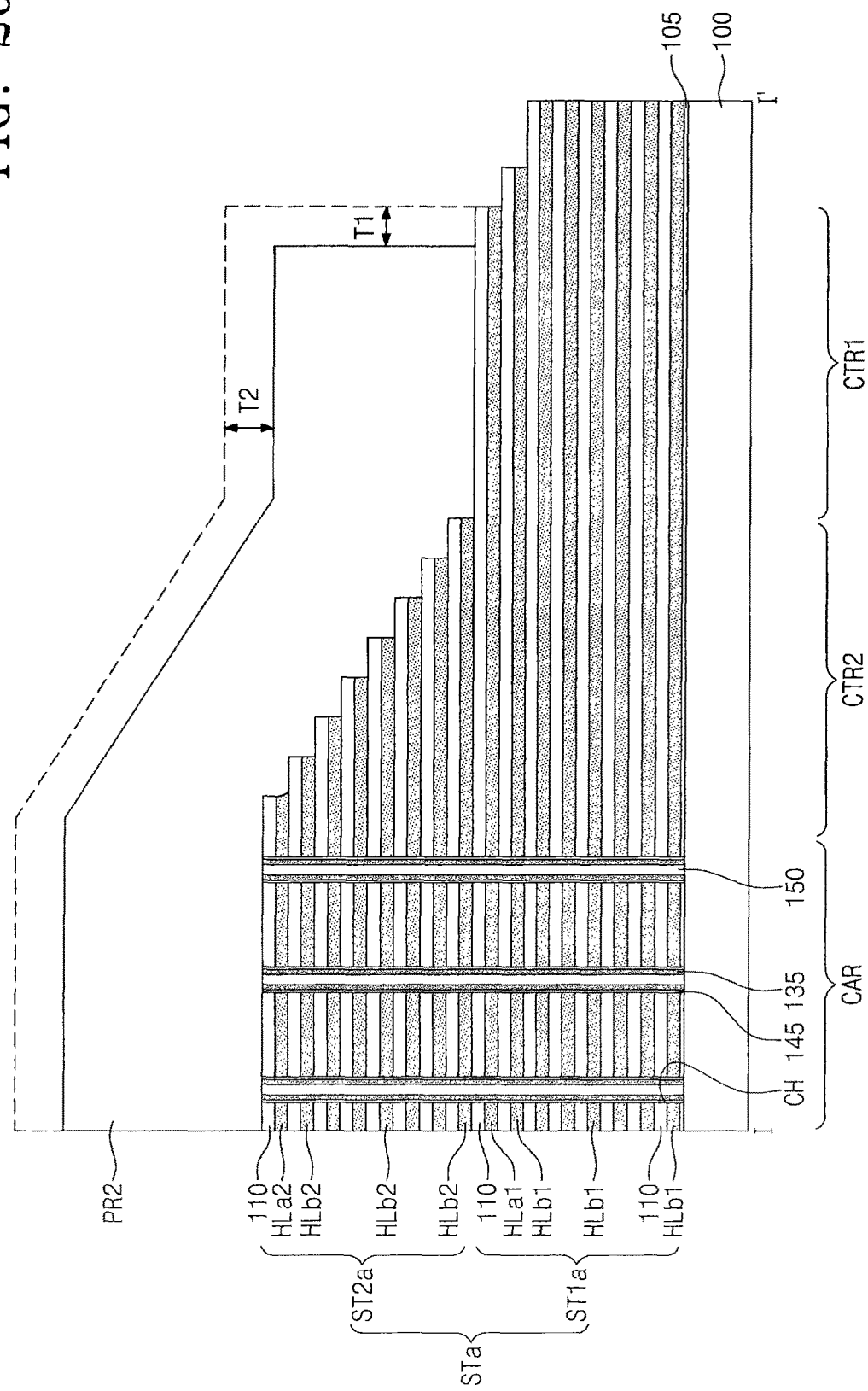

Referring to FIGS. 2 and 20, the trimming process may be performed again on the second photoresist pattern PR2. Thus, the cycle may be repeated once more.

Figure 21:
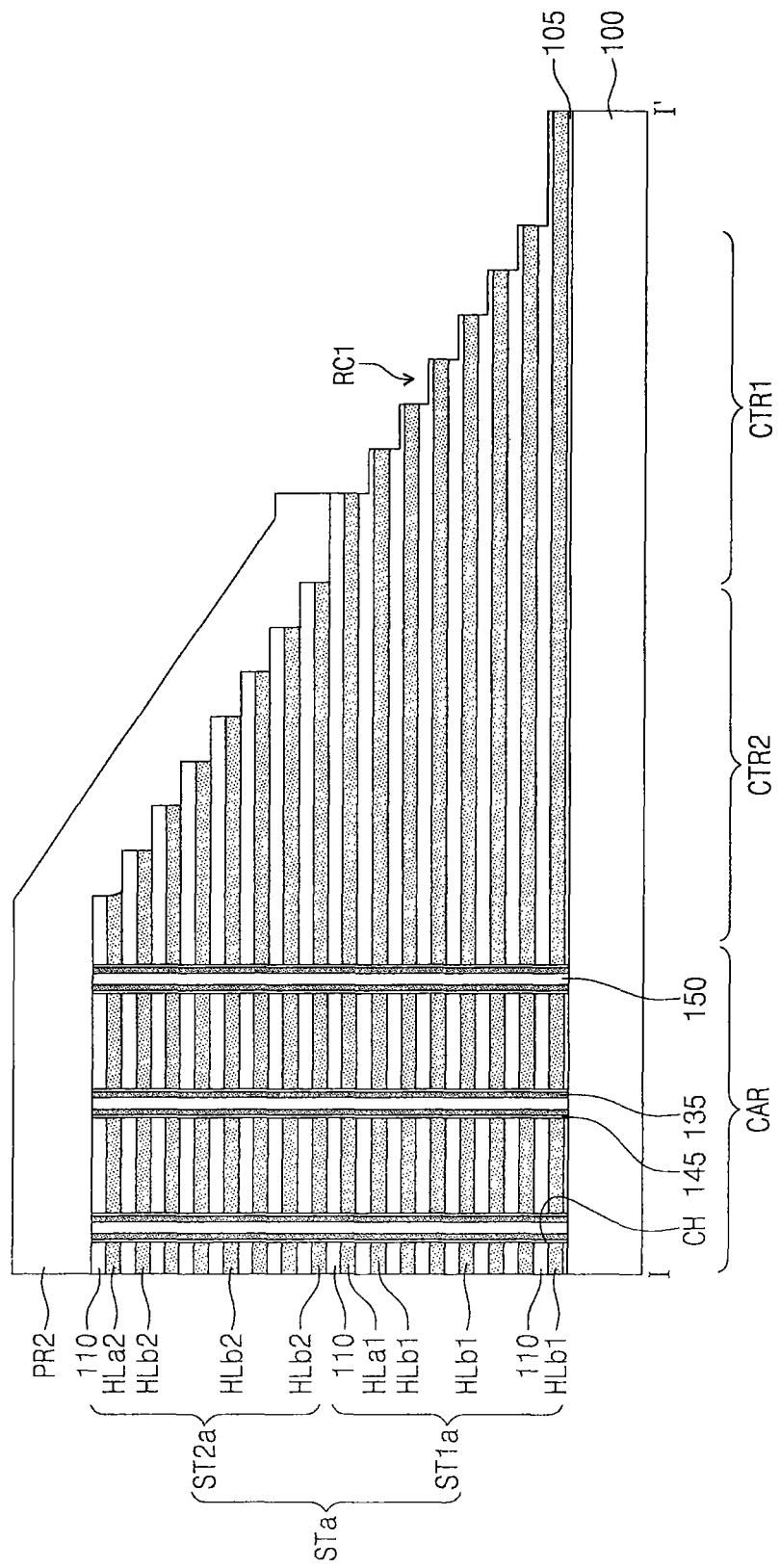

Referring to FIGS. 2 and 21, the cycle may be repeated such that an end portion of the first stack structure layer ST1a of the first contact region CTR1 may have a stepwise structure. In addition, the size of the second photoresist pattern PR2 may be reduced by the repeated trimming processes.

Meanwhile, as described with reference to FIG. 12, since the first etching process and the second etching process of the cycle are repeated, upper portions of insulating layers 110 exposed by the second photoresist pattern PR2 may be over-etched. Thus, first recesses RC1 may be formed in the upper insulating layers 110 of the first stack structure layer ST1a, respectively.

Figure 22:
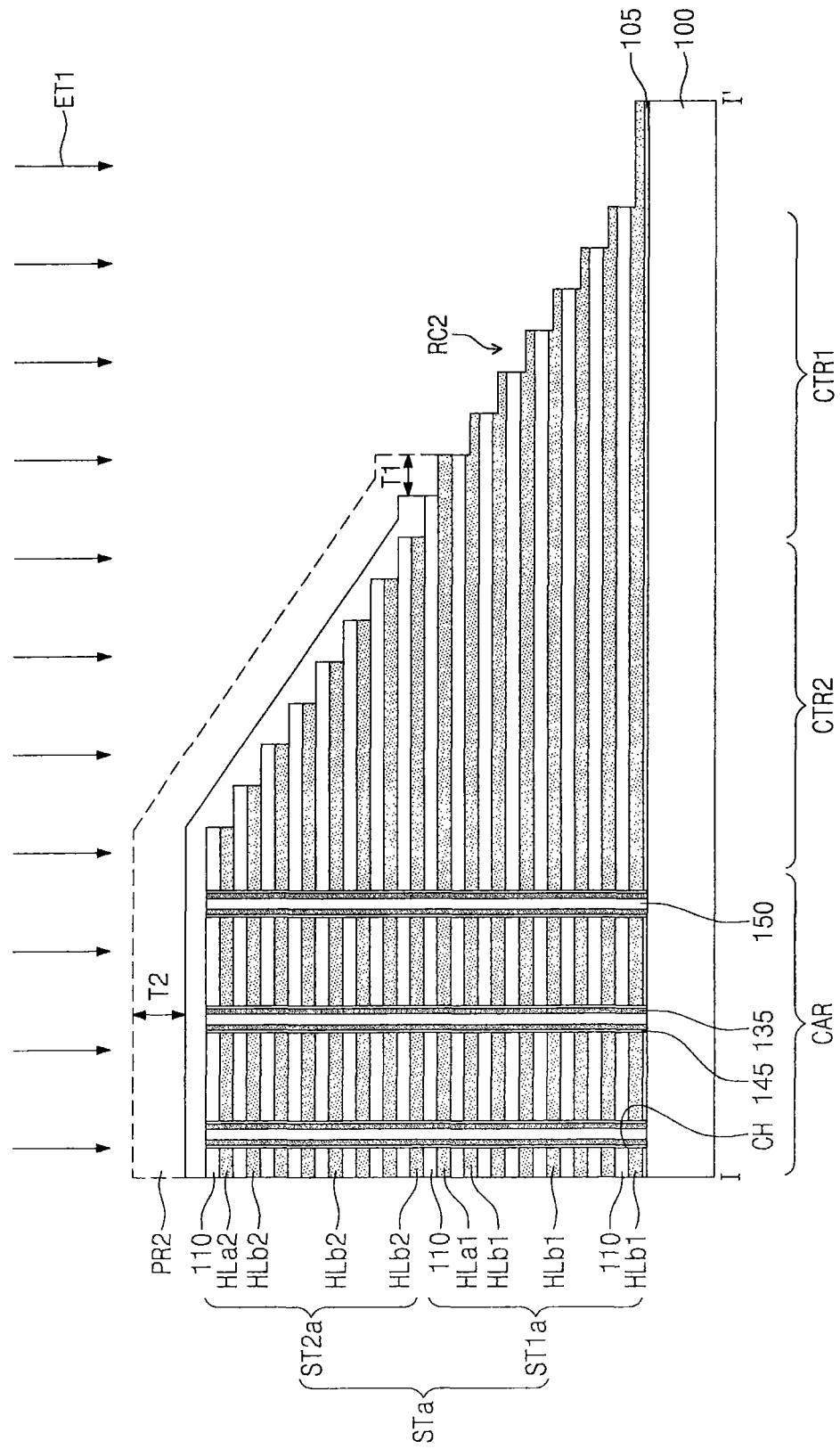

Referring to FIGS. 2 and 22, the trimming process may be performed using the second photoresist pattern PR2. Thereafter, the first etching process ET1 may be performed on the insulating layers 110 exposed by the second photoresist pattern PR2. At this time, as described with reference to FIG. 13, upper portions of the first lower sacrificial layers HLb1 may be etched by over-etching, and thus second recesses RC2 may be formed in the upper portions of the first lower sacrificial layers HLb1, respectively.

Figure 23:
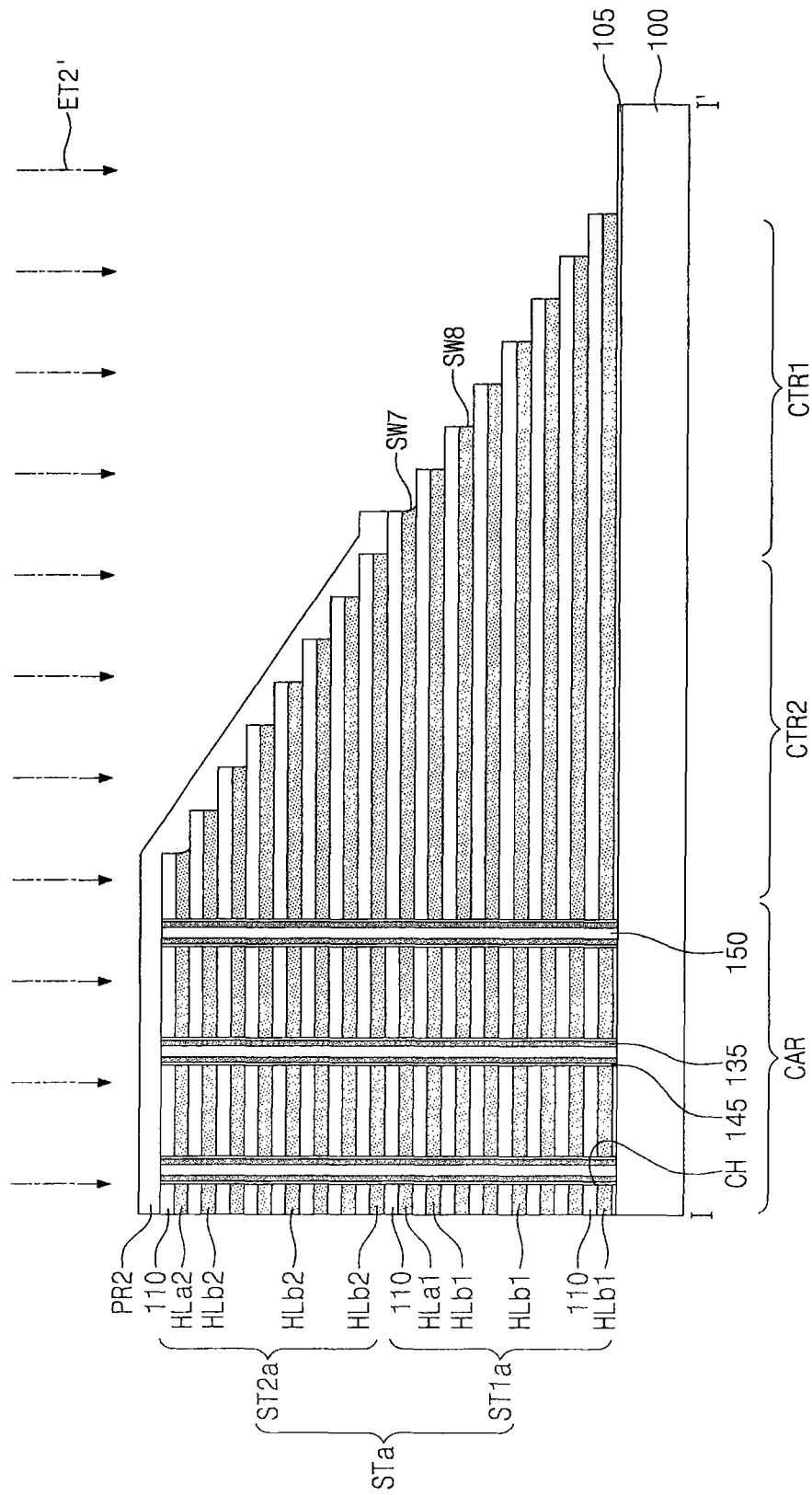

Referring to FIGS. 2 and 23, the changed second etching process ET2' may be performed to selectively etch the first sacrificial layers HLb1 and HLa1 exposed by the second photoresist pattern PR2. The changed second etching process ET2' may be the same as described with reference to FIG. 14.

The first upper sacrificial layer HLa1 may have a seventh sidewall SW7 having a gentle slope after the changed etching process ET2'. On the other hand, since the exposed first lower sacrificial layers HLb1 have relatively thin thicknesses, the first lower sacrificial layers HLb1 may respectively have eighth sidewalls SW8 having substantially vertical slopes after the changed second etching process ET2'. In other words, the slope of the seventh sidewall SW7 may be gentler than each of the eighth sidewalls SW8.

Figure 24:
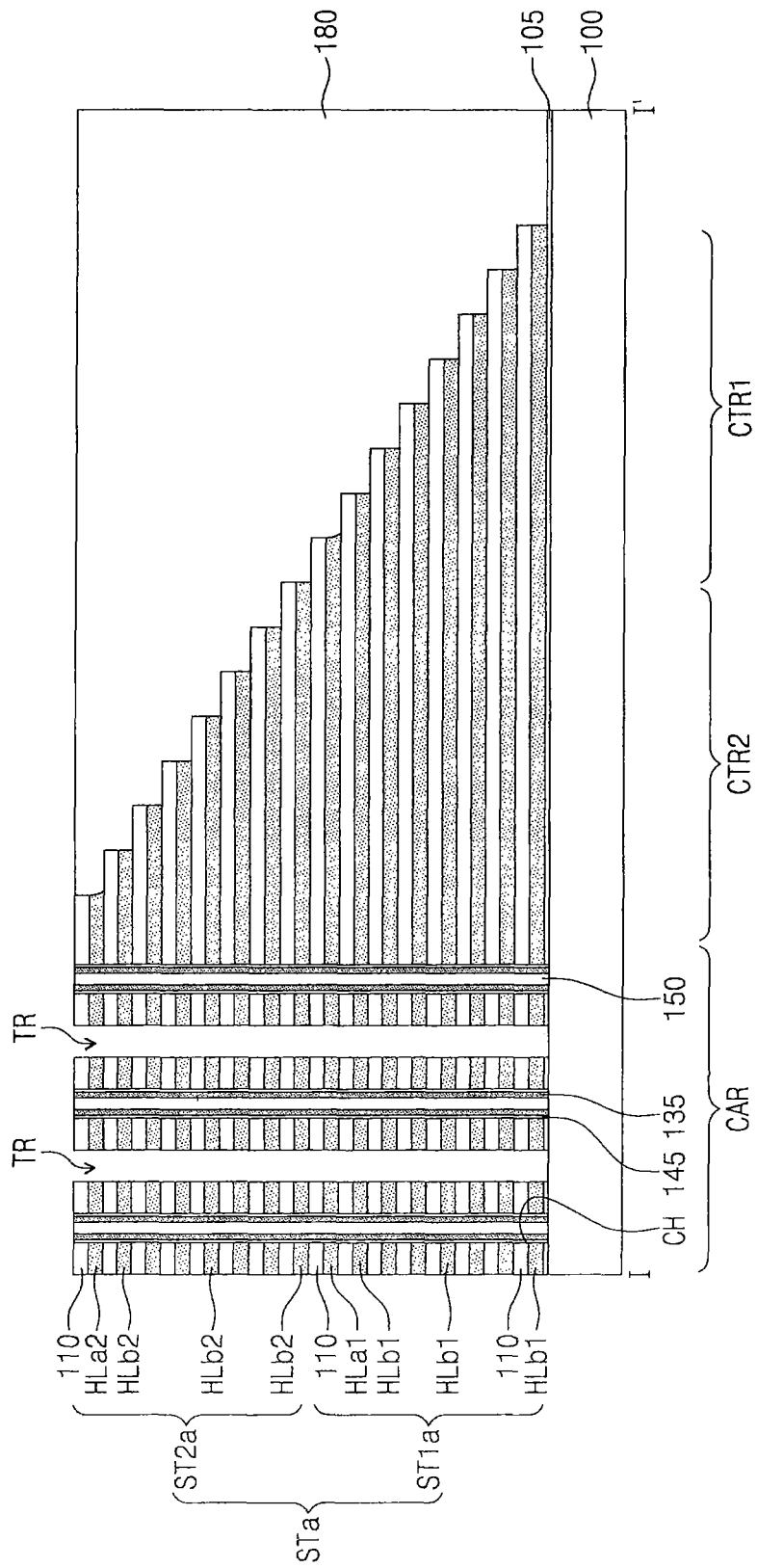

Referring to FIGS. 2 and 24, the second photoresist pattern PR2 may be removed, and a first interlayer insulating layer 180 may be then formed on the substrate 100 to cover the stack structure layer STa having the stepwise structure. The first interlayer insulating layer 180 may be formed to cover the stepwise structure of the stack structure layer STa disposed on the substrate 100 of the first and second contact regions CTR1 and CTR2. The first interlayer insulating layer 180 may be planarized to expose a top surface of the second stack structure layer ST2a disposed on the substrate 100 of the cell array region CAR.

Next, the stack structure layer STa may be patterned to form trenches TR exposing the substrate 100. The trenches may be spaced apart from the channel holes CH. The formation of the trenches TR may include forming mask patterns defining the trenches TR on the stack structure layer STa, and etching the stack structure layer STa using the mask patterns as an etch mask.

The trenches TR may be formed to cover sidewalls of the sacrificial layers HLb1, HLa1, HLb2, and HLa2 and sidewalls of the insulating layers 110. In some embodiments, the trenches TR may also expose sidewalls of the lower insulating layer 105. Even though not shown in the drawings, a width of the trench TR may be varied according to a vertical distance from the substrate 100.

The stack structure layer STa may be divided into a plurality of stack segments by the trenches TR. Each of the stack segments may have a linear shape extending in the second direction D2. A plurality of the channel layers 135 may penetrate each of the stack segments.

Figure 25:
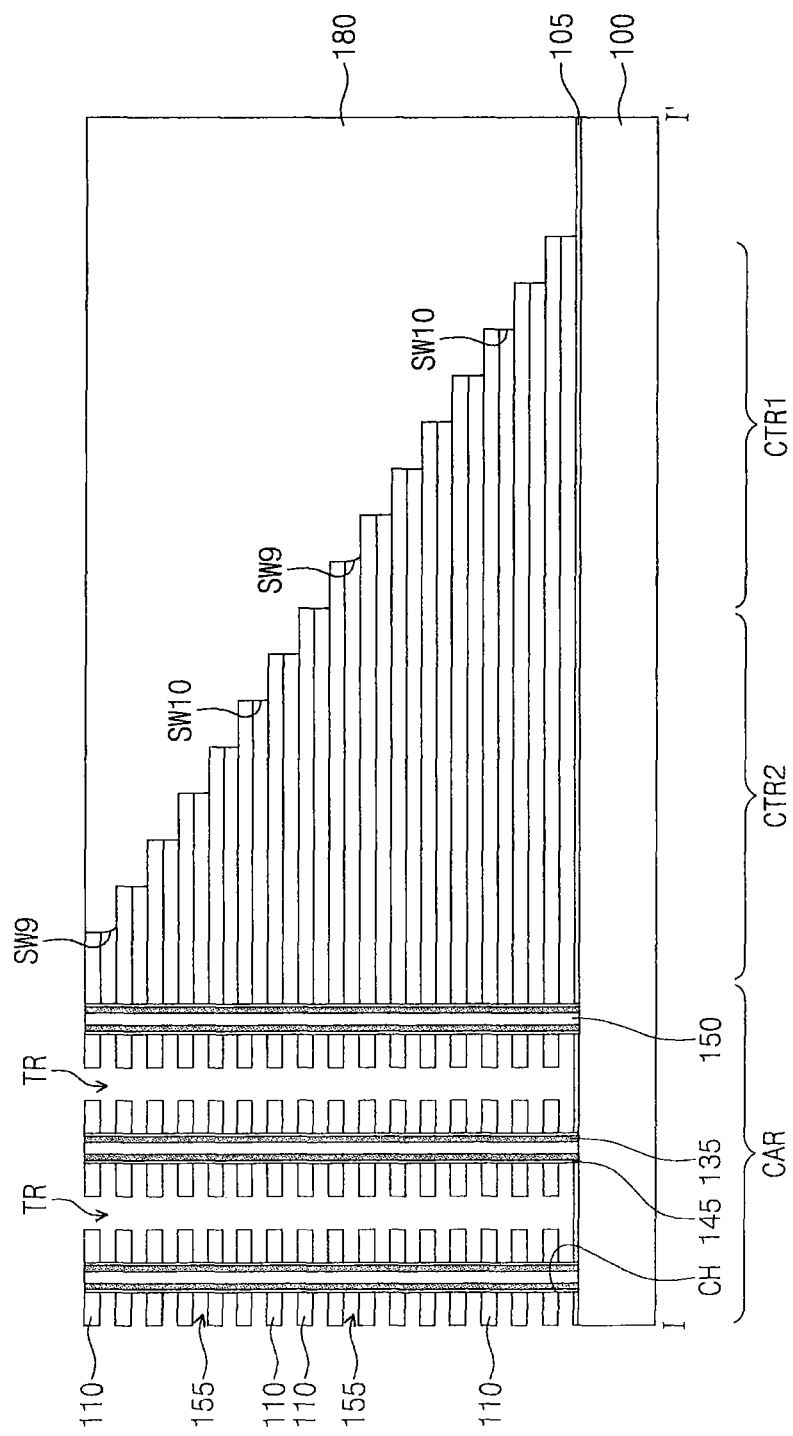

Referring to FIGS. 2 and 25, the sacrificial layers HLb1, HLa1, HLb2, and HLa2 exposed by the trenches TR may be selectively removed to form recess regions 155. The recess regions 155 may correspond to empty regions formed by removing the sacrificial layers HLb1, HLa1, HLb2, and HLa2. When the sacrificial layers HLb1, HLa1, HLb2, and HLa2 include silicon nitride or silicon oxynitride, the removal process of the sacrificial layers HLb1, HLa1, HLb2, and HLa2 may be performed using an etching solution including phosphoric acid. Portions of a sidewall of the gate insulating layer 145 may be exposed through the recess regions 155.

Meanwhile, the first interlayer insulating layer 180 exposed by the recess regions 155 may have ninth sidewalls SW9 and tenth sidewalls SW10. The ninth sidewalls SW9 may correspond to the fifth sidewalls SW5 of the second upper sacrificial layer HLa2 and the seventh sidewall SW7 of the first upper sacrificial layer HLa1, respectively. Thus, the ninth sidewalls SW9 may be sloped sidewalls. The tenth sidewalls SW10 may correspond to the sixth sidewalls SW6 of the second lower sacrificial layers HLb2 and the eighth sidewalls SW8 of the first lower sacrificial layers HLb1, respectively. The tenth sidewalls SW10 may be substantially vertical sidewalls.

Figure 26:
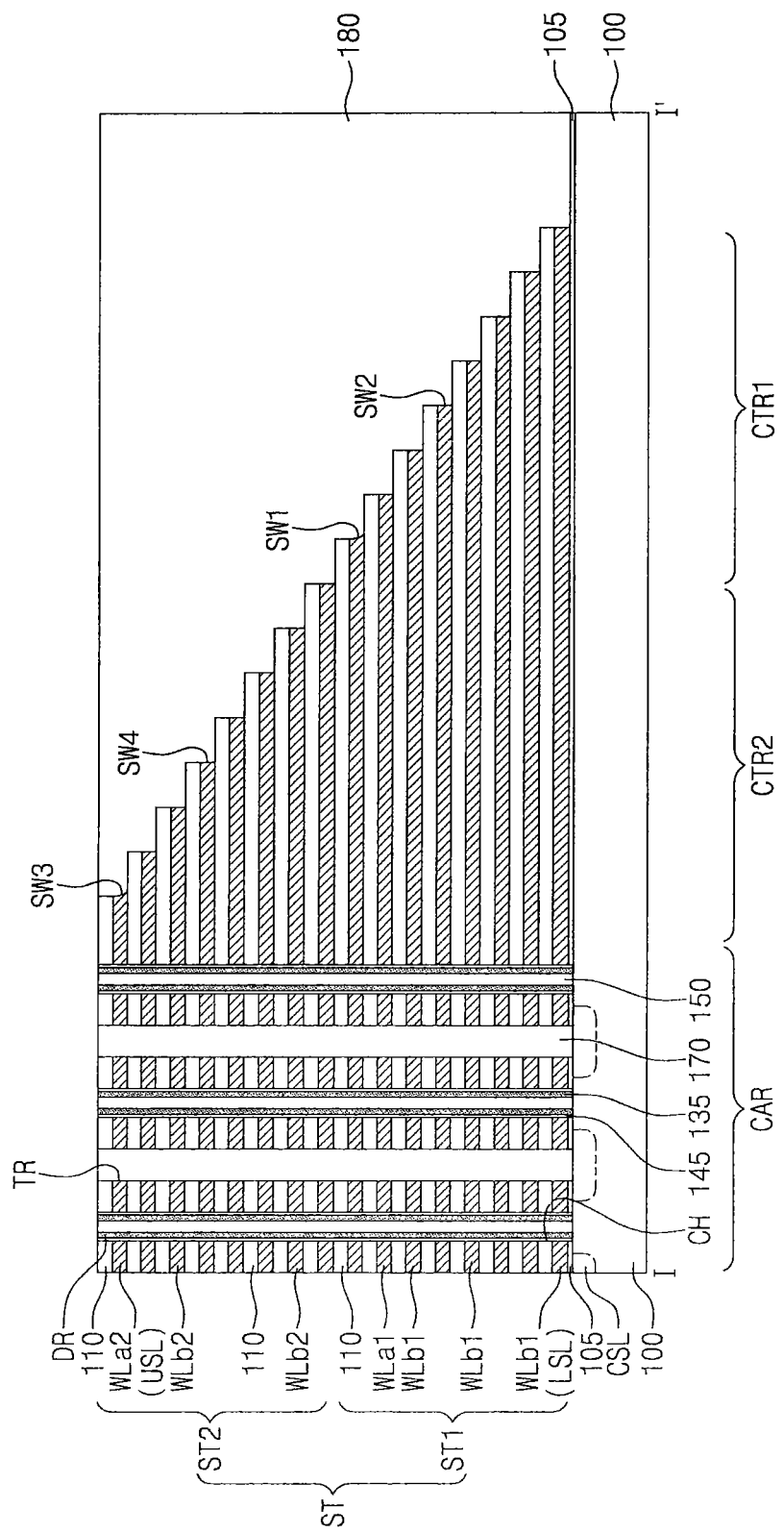
Figure 27:
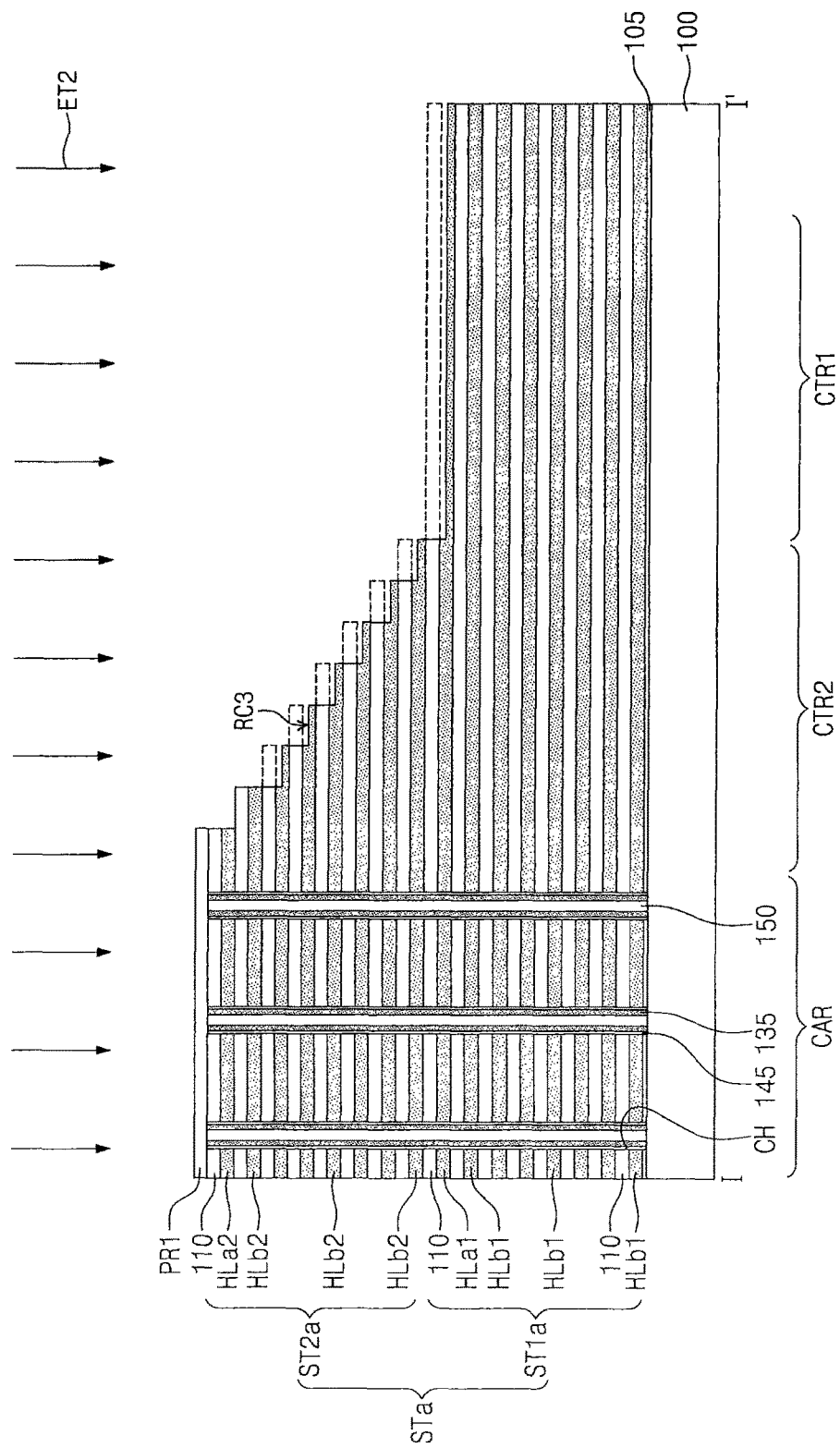
FIG. 27 is a cross-sectional view corresponding to the line I-I' of FIG. 2 to illustrate a manufacturing method for comparison with embodiments of the inventive concepts.

Referring to FIGS. 2 and 26, gate electrodes WLb1, WLa1, WLb2, and WLa2 may be formed in the recess regions 155, respectively. Thus, the stack structures ST of FIG. 3A may be formed. In some embodiments, the formation of the gate electrodes WLb1, WLa1, WLb2, and WLa2 may include forming a conductive layer filling the recess regions 155, and removing the conductive layer disposed outside the recess regions 155.

A first upper gate electrode WLa1 may have a first sidewall SW1 having a gentle slope, and a second upper gate electrode WLa2 may have a third sidewall SW3 having a gentle slope. First lower gate electrodes WLb1 may respectively have second sidewalls SW2 which are substantially vertical, and second lower gate electrodes WLb2 may respectively have fourth sidewalls SW4 which are substantially vertical. The first and third sidewalls SW1 and SW3 may correspond to the ninth sidewalls SW9, respectively, and the second and fourth sidewalls SW2 and SW4 may correspond to the tenth sidewalls SW10, respectively.

Common source regions CSL may be formed in the substrate 100 after the formation of the gate electrodes WLb1, WLa1, WLb2, and WLa2. The common source regions CSL may be formed using an ion implantation process and may be formed in the substrate 100 under the trenches TR. Each of the common source regions CSL and the substrate 100 may constitute a PN junction. Drain regions DR may be respectively formed in upper portions of the channel layers 135 by an ion implantation process.

When the gate insulating layer 145 includes a tunnel insulating layer and a charge storage layer, a blocking insulating layer (not shown) may be additionally formed in the recess regions 155 before the formation of the gate electrodes WLb1, WLa1, WLb2, and WLa2. Subsequently, the gate electrodes WLb1, WLa1, WLb2, and WLa2 may be formed on the blocking insulating layer in the recess regions 155, respectively.

Referring again to FIGS. 2 and 3A, the filling insulation layer 170 may be formed to fill the trenches TR. The filling insulation layer 170 may include a silicon oxide layer.

The conductive pads 160 may be formed to be in contact with the top surfaces of the channel layers 135, respectively. Next, the second interlayer insulating layer 190 may be formed to cover the filling insulation layer 170, the conductive pads 160, and the first interlayer insulating layer 180. The bit line plugs BPLG may be formed to penetrate the second interlayer insulating layer 190. The bit line plugs BPLG may be in contact with the conductive pads 160, respectively The first contact plugs PLG1 may be formed to penetrate the second and first interlayer insulating layers 190 and 180. The first contact plugs PLG1 may be connected to the first gate electrodes WLb1 and WLa1 of the first contact region CTR1, respectively. The second contact plugs PLG2 may be formed to penetrate the second and first interlayer insulating layers 190 and 180. The second contact plugs PLG2 may be connected to the second gate electrodes WLb2 and WLa2 of the second contact region CTR2, respectively.

The bit lines BL extending in the first direction D1 may be formed on the second interlayer insulating layer 190. Each of the bit lines BL may be connected to a plurality of the bit line plugs BPLG arranged in the first direction D1. The first and second connection lines CL1 and CL2 may be formed on the second interlayer insulating layer 190 so as to be connected to the first and second contact plugs PLG1 and PLG2, respectively.

As described above, the etch rate of the etching process of the last one of the cycles for forming the stepwise structure of the stack structure layer may be lowered to reduce a process risk and to form the normal stepwise structure. As a result, in the semiconductor device according to some embodiments of the inventive concepts, the sidewall of at least one of the stacked gate electrodes may have a gentler slope than the sidewalls of others of the stacked gate electrodes.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A semiconductor device comprising:
   a substrate including a first region and a second region spaced apart from the first region in one direction;
   a first stack structure including a first insulating layer, a first gate electrode, a second insulating layer and a second gate electrode stacked on the substrate;
   a second stack structure including a third insulating layer, a third gate electrode, a fourth insulating layer and a fourth gate electrode stacked on the first stack structure;
   a channel structure vertically extending in the first stack structure and the second stack structure disposed on the substrate of the first region,
   wherein the first stack structure and the second stack structure have a stepwise structure on the substrate of the second region,
   wherein an end of the first gate electrode of the second region includes a first sidewall and an end of the second gate electrode of the second region has a second sidewall having a steeper slope than the first sidewall,
   wherein an end of the third gate electrode of the second region includes a third sidewall and an end of the fourth gate electrode of the second region has a fourth sidewall having a steeper slope than the third sidewall, and
   wherein the third sidewall of the third gate electrode is closer to the channel structure than the fourth sidewall of the fourth gate electrode.

2. The semiconductor device of claim 1, wherein the first, second, third and fourth gate electrodes include a doped silicon.

3. The semiconductor device of claim 1, wherein the third sidewall has a substantially same slope as the first sidewall, and wherein the second sidewall has a substantially same slope as the fourth sidewall.

4. The semiconductor device of claim 1, wherein the third gate electrode is an upper selection line.

5. The semiconductor device of claim 4, wherein the second gate electrode is a lower selection line.

6. The semiconductor device of claim 1, wherein a vertical slope of the first sidewall of the first gate electrode is in a range from 30 degrees to 85 degrees as measured relative to a normal to a primary surface of the substrate.

7. The semiconductor device of claim 1, further comprising:
   a gate insulating layer disposed between the channel structure and the second gate electrode.

8. A semiconductor device comprising:
   a substrate including a first region and a second region spaced apart from the first region in one direction;
   a first stack structure including a first insulating layer, a first gate electrode, a second insulating layer and a second gate electrode stacked on the substrate;
   a second stack structure including a third insulating layer, a third gate electrode, a fourth insulating layer and a fourth gate electrode stacked on the first stack structure;
   a channel structure vertically extending in the first stack structure and the second stack structure disposed on the substrate of the first region,
   wherein the first stack structure and the second stack structure have a stepwise structure on the substrate of the second region,
   wherein an end of the third gate electrode of the second region includes a third sidewall and an end of the fourth gate electrode of the second region has a fourth sidewall having a steeper slope than the third sidewall, and
   wherein the third sidewall of the third gate electrode is closer to the channel structure than the fourth sidewall of the fourth gate electrode.

9. The semiconductor device of claim 8, further comprising a first vertical contact plug, which is electrically connected to an upper surface of the first gate electrode;

a second vertical contact plug, which is electrically connected to an upper surface of the second gate electrode, wherein the first vertical contact plug is shorter than the second vertical contact plug.

10. The semiconductor device of claim 9, further comprising a third vertical contact plug, which is electrically connected to an upper surface of the third gate electrode;

a fourth vertical contact plug, which is electrically connected to an upper surface of the fourth gate electrode, wherein the third vertical contact plug is shorter than the fourth vertical contact plug, and longer than the second vertical contact plug.

11. A non-volatile memory device, comprising:

a vertical stack of inter-gate insulating layers and gate electrodes arranged in an alternating sequence on a substrate, the substrate having a cell array region and a contact region; and a NAND-type channel structure extending vertically through the vertical stack of inter-gate insulating layers and the gate electrodes, on the cell array region, wherein an end sidewall of a first of the gate electrodes that extends laterally over at least a portion of the contact region has a first slope that is less steep than a second slope of end sidewall of a second of the gate electrodes extending between the first of the gate electrodes and the substrate, wherein an end sidewall of a third of the gate electrodes that extends laterally over the at least a portion of the contact region has a third slope that is less steep than a fourth slope of end sidewall of a fourth of the gate electrodes extending between the third of the gate electrodes and the substrate, wherein the first of the gate electrodes is an uppermost one of the gate electrodes.

12. The memory device of claim 11, wherein the first, second, third and fourth of gate electrodes include a doped silicon.

13. The memory device of claim 12, wherein the third of the gate electrodes is sandwiched between the second of gate electrodes and the fourth of the gate electrodes.

14. The memory device of claim 11, further comprising a first vertical contact plug, which is electrically connected to an upper surface of the first of the gate electrodes; and a second vertical contact plug, which is electrically connected to an upper surface of the second of the gate electrodes, wherein the first vertical contact plug is shorter than the second vertical contact plug.

15. The memory device of claim 14, wherein the end sidewall of the first of the gate electrodes is closer to said NAND-type channel structure than the end sidewall of the third of the gate electrodes.

16. The memory device of claim 14, wherein an average slope of the end sidewall of the first of the gate electrodes is in a range from 30 degrees to 85 degrees as measured relative to a normal to a primary surface of the substrate.

17. The memory device of claim 16, wherein an average slope of the end sidewall of the third of the gate electrodes is in a range from 5 degrees to 60 degrees as measured relative to a normal to a primary surface of the substrate.

* * * * *